US012660286B2

(12) United States Patent
Lee

(10) Patent No.: US 12,660,286 B2
(45) Date of Patent: Jun. 16, 2026

(54) VERTICAL THIN FILM TRANSISTOR WITH PERFORATED OR COMB-GATE ELECTRODE CONFIGURATION AND FABRICATION METHODS FOR SAME

(71) Applicant: Solsona Enterprise, LLC, San Diego, CA (US)

(72) Inventor: Chong Uk Lee, Carlsbad, CA (US)

(73) Assignee: Solsona Enterprise, LLC, San Diego, CA (US)

( * ) Notice: Subject to any disclaimer, the term of this patent is extended or adjusted under 35 U.S.C. 154(b) by 1107 days.

(21) Appl. No.: 17/453,045

(22) Filed: Nov. 1, 2021

(65) Prior Publication Data

US 2022/0052172 A1     Feb. 17, 2022

Related U.S. Application Data

(60) Continuation-in-part of application No. 17/302,769, filed on May 12, 2021, now Pat. No. 11,881,515, (Continued)

(51) Int. Cl.
*H10D 64/27* (2025.01)
*H10D 30/00* (2025.01)
(Continued)

(52) U.S. Cl.
CPC ......... *H10D 64/519* (2025.01); *H10D 30/501* (2025.01); *H10D 30/502* (2025.01); (Continued)

(58) Field of Classification Search
CPC .......... H10D 30/501–504; H10D 30/506–509; H10D 30/6704; H10D 30/6728; (Continued)

(56) References Cited

U.S. PATENT DOCUMENTS 4,470,059 A     9/1984 Nishizawa et al.
2006/0208251 A1     9/2006 Yoshizawa
(Continued)

OTHER PUBLICATIONS

Li, et al.; "High Speed Circuit with Bulk Accumulation Mode a-IGZO TFTs", 2014 21st International Workshop on Active-Matrix Flatpanel Displays and Devices (AM-FPD); Jul. 2014; pp. 137-139.
(Continued)

*Primary Examiner* — Marcos D. Pizarro
(74) *Attorney, Agent, or Firm* — Lipsitz & McAllister, LLC

(57)     ABSTRACT

The present invention provides a vertical-type thin film transistor (TFT) and methods of fabricating vertical TFTs. The vertical TFT may comprise a source electrode and a drain electrode, the drain electrode and the source electrode being positioned on vertically separated planes. A semiconductor layer may be arranged in between the source electrode and the drain electrode. At least one gate electrode may be embedded in the semiconductor layer. At least one of the source electrode and the drain electrode comprise patterned electrodes. One or all of the gate electrodes, the source electrode and the drain electrode may be patterned electrodes. The patterned electrodes may comprise one or more of fingers or combs, micro perforations, a mesh structure, or a lattice structure. Back side exposed fabrication techniques may be used to fabricate various of the vertical TFT embodiments.

20 Claims, 23 Drawing Sheets

Related U.S. Application Data which is a division of application No. 16/397,341, filed on Apr. 29, 2019, now Pat. No. 11,049,948.

(60) Provisional application No. 63/198,992, filed on Nov. 30, 2020, provisional application No. 63/198,774, filed on Nov. 12, 2020, provisional application No. 62/691,795, filed on Jun. 29, 2018.

(51) Int. Cl.
*H10D 30/67*       (2025.01)
*H10D 64/23*       (2025.01)

(52) U.S. Cl.
CPC ......... *H10D 30/503* (2025.01); *H10D 30/504* (2025.01); *H10D 30/506* (2025.01); *H10D 30/507* (2025.01); *H10D 30/508* (2025.01); *H10D 30/509* (2025.01); *H10D 30/6704* (2025.01); *H10D 30/6728* (2025.01); *H10D 30/6729* (2025.01); *H10D 30/673* (2025.01); *H10D 30/6733* (2025.01); *H10D 30/6734* (2025.01); *H10D 30/6736* (2025.01); *H10D 30/674* (2025.01); *H10D 30/6757* (2025.01); *H10D 64/252* (2025.01); *H10D 64/2523* (2025.01); *H10D 64/2527* (2025.01); *H10D 64/258* (2025.01); *H10D 64/512* (2025.01); *H10D 64/518* (2025.01)

(58) Field of Classification Search
CPC ............. H10D 30/6729; H10D 30/673; H10D 30/6733; H10D 30/6734; H10D 30/6736; H10D 30/674; H10D 30/6757; H10D 64/252; H10D 64/2523; H10D 64/2527; H10D 64/258; H10D 64/512; H10D 64/518; H10D 64/519

See application file for complete search history.

(56)            References Cited

U.S. PATENT DOCUMENTS

| | | |
|---|---|---|
| 2019/0393222 A1 | 12/2019 | Sharma et al. |
| 2020/0044095 A1 | 2/2020 | Wang et al. |
| 2020/0098930 A1 | 3/2020 | Le et al. |

OTHER PUBLICATIONS

Baek, et al.; "Electrical Properties and Stability of Dual-Gate Coplanar Homojunction DC Sputtered Amorphous Indium-Gallium-Zinc-Oxide Thin-Film Transistors and Its Application to AM-OLEDs"; IEEE Transactions on Electron Devices, vol. 58, No. 12; Dec. 2011; pp. 4344-4353.

Dollinger, et al.; "Vertical Organic Thin-Film Transistors with Anodized Permeable Base for Very Low Leakage Current; Advanced Materials"; Mar. 2019, pp. 1-17.

Fan, et al.; "A Self-Aligned a-IGZO Thin-Film Transistor Using a New Two-Photo-Mask Process with a Continuous Etching Scheme"; Materials 2014, Aug. 11, 2014; pp. 5761-5768.

EFA (Electric Field Assisted) Annealing for gate oxide self-formation

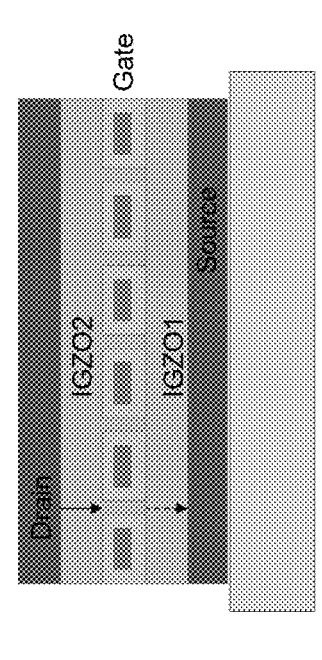
VTFT Type I (staggered gates) – off state
FIG. 15A
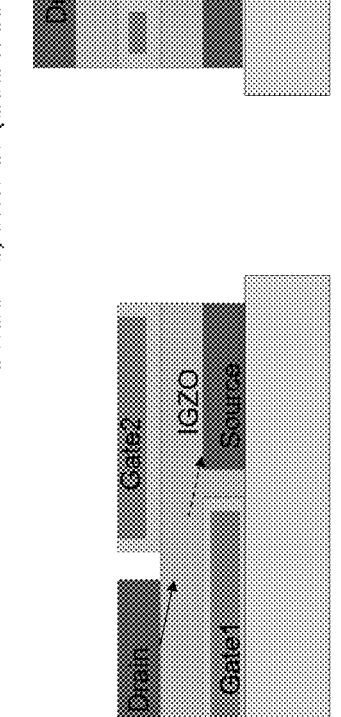
VTFT Type III (comb gates) – off state
FIG. 15C
Positive E-field, when Drain to Source voltage > 0
E-field <= 0, when off (Gate to Source voltage <= 0)
VTFT Type II (micro perforated gate) – off state
FIG. 15B
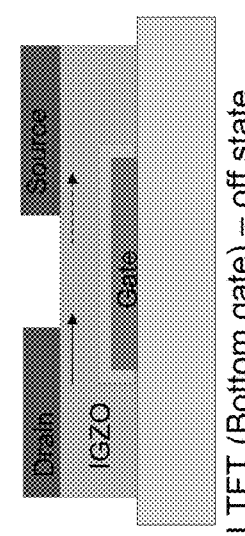
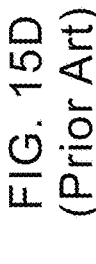
LTFT (Bottom gate) – off state
FIG. 15D
(Prior Art)

Borosilica Glass UV Transmission

IGZO UV Transmission

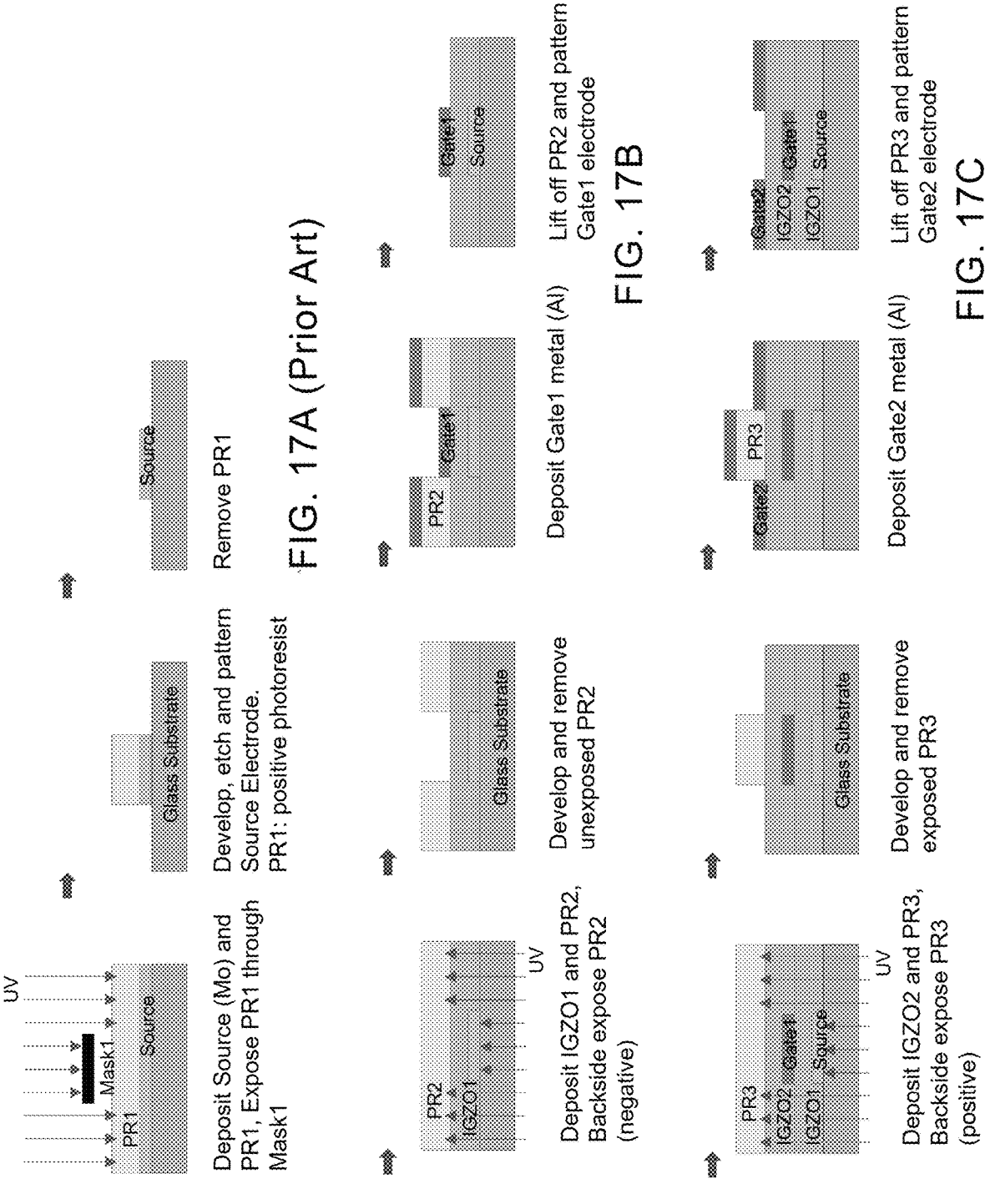

Deposit Source (Mo) and PR1, Expose PR1 through Mask1

Develop, etch and pattern Source Electrode. PR1: positive photoresist

Remove PR1

FIG. 17A (Prior Art)

Deposit IGZO1 and PR2, Backside expose PR2 (negative)

Develop and remove unexposed PR2

Deposit Gate1 metal (Al)

Lift off PR2 and pattern Gate1 electrode

FIG. 17B

Deposit IGZO2 and PR3, Backside expose PR3 (positive)

Develop and remove exposed PR3

Deposit Gate2 metal (Al)

Lift off PR3 and pattern Gate2 electrode

FIG. 17C

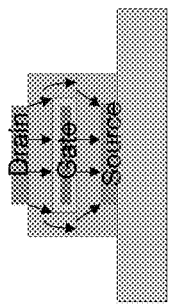

Singe Finger Type II-b-sf VTFT
$V_{GS} \leq 0$: no current flows (off)

FIG. 18C

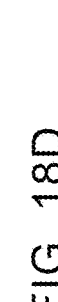

Singe Finger Type II-b-sf VTFT
$V_{GS} > 0$, $V_{DS} > 0$: current flows (on)

FIG. 18F

← Positive E-field, when Drain to Source voltage > 0
← E-field <=0, when off (Gate to Source voltage <= 0)

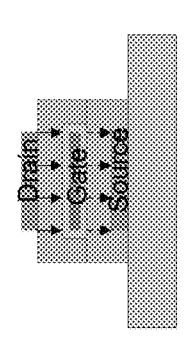

Multi Finger Type II-b-mf VTFT
$V_{GS} \leq 0$: no current flows (off)

FIG. 18B

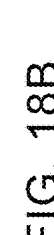
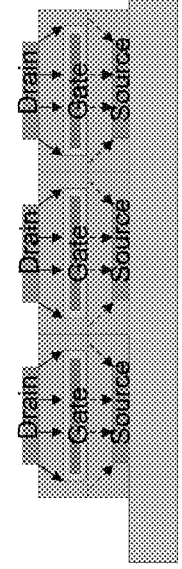

Multi Finger Type II-b-mf VTFT
$V_{GS} > 0$, $V_{DS} > 0$: current flows (on)

FIG. 18E

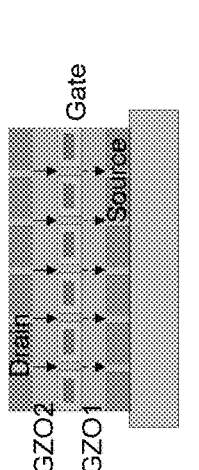

VTFT Type II (micro perforated gate) – off state

FIG. 18A

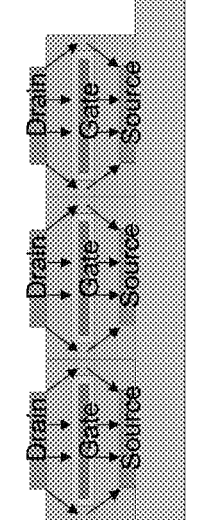

VTFT Type II (micro perforated gate) – on state

FIG. 18D

VERTICAL THIN FILM TRANSISTOR WITH PERFORATED OR COMB-GATE ELECTRODE CONFIGURATION AND FABRICATION METHODS FOR SAME

This application is a continuation-in-part of commonly-owned U.S. patent application Ser. No. 17/302,769 filed on May 12, 2021, which is a divisional of commonly-owned U.S. application Ser. No. 16/397,341 filed on Apr. 29, 2019 (now U.S. Pat. No. 11,049,948), which claims the benefit of U.S. provisional patent application No. 62/691,795 filed on Jun. 29, 2018. This application also claims the benefit of U.S. provisional patent application No. 63/198,774 filed on Nov. 12, 2020 and U.S. provisional patent application No. 63/198,992 filed on Nov. 30, 2020. Each of the foregoing applications are incorporated herein and made a part hereof by reference.

BACKGROUND OF THE INVENTION

The present invention relates to the field of thin film transistors (TFTs). More specifically, the present invention relates to a vertical-structure TFT having a gate electrode structure adapted to allow the flow of electrons therethrough. Corresponding methods of producing such a vertical-type TFT are also provided, including but not limited to BSE (back side exposed) fabrication techniques.

Conventional TFTs have a planar Source-Drain structure. The Source and the Drain contact/electrode are horizontally arranged, with an active semiconducting material in between the Source and Drain. The Gate metal-oxide-semiconductor (MOS) structure is vertically arranged. The Gate electrode that controls the flow of electrons or holes between the horizontally placed Source and Drain contacts thru the semiconductor material. Such a structure is easy to build using a thin film deposition and etching/lift-off process. The carriers (electrons or holes) move between the Source and the Drain in a thin layer, forming a 2-D sheet channel layer that is typically less than tens of nanometers thick.

For example, wide bandgap metal oxide semiconductor (typically bandgap >3.0 eV) based TFTs are promising for low-cost, flexible, wearable and disposal device applications because of their features such as low temperature processability and compatibility with a wide variety of low-cost deposition processes, including solution-based processes. However, the typical transistor mobility is only about 10 $cm^2/Vs$ in such a standard TFT device with a lateral active channel with a typical length of about 5-20 microns (i.e., effective channel length). Therefore, the controllable drain current is limited to the level of mA. Typical TFT dimensions are as follows: approximately 50 nm-thick Source and Drain electrodes; approximately 150 nm-thick Gate oxide; approximately 50 nm-thick channel layer; and approximately 50 nm-thick gate electrode. Therefore, a typical aspect ratio of the vertical/lateral dimensions is approximately 300 nm/10000 nm.

FIG. 1A shows a typical prior art oxide-TFT structure with a lateral active channel (typically, the channel length is about 5-20 microns, and the channel width is about 10-20 microns) having a bottom-gate structure, while FIG. 1B shows a typical prior art oxide-TFT structure with a lateral active channel having a top-gate structure. Current flows from drain to source laterally in both structures (electron moves from source to drain.)

Thin Film Transistors, especially those fabricated for flat panel display (FPD, i.e., LCD, OLED, etc.), typically have relatively large feature dimensions, in the order of a few micrometers or larger. The distance between the source and the drain is relatively large, sometimes several micrometers or more. The longer the channel length between the source and the drain is, the longer the distance the current carriers have to travel. Therefore, the resulting transistor switches slowly. In many cases, the channel length is limited by the fineness of the patterning process, either by photo lithography or printing, or other patterning methods. On the other hand, the thickness of the layers, as the thin film process implies, can be much smaller in dimension. That is, the thickness of the individual layers can be as thin as the deposition process can produce, limited by the uniformity of the film that is laid down. Often times, this thickness can be controlled to 100's of nanometers, sometimes 10's of nanometers and sometimes several nanometers. This opens up an opportunity to consider a vertical transistor structure, where the current carriers traverse vertically between layers, rather than horizontally.

It would be advantageous to leverage the ability to control the layer thickness to enable a vertical transistor structure and to enable the use of a vertically arranged gate electrode structure. Such a structure would advantageously provide transistor operations with low switching times and high drain current.

Thin Film Transistors (TFT) were traditionally built on a flat substrate such as a sheet of glass or a polymer film. Different material layers are patterned by various micro photolithography techniques that etch away unwanted parts of the material. In other cases, additive techniques were developed where the material is screen or inkjet printed only where needed in an additive fashion. The present invention will focus on photolithography techniques, even though the vertical thin film transistors (VTFTs) disclosed herein can be also built using additive techniques.

A photolithography usually deposits a thin film of desired material uniformly on a substrate, coats that layer uniformly with a photoresist (PR), then uses a photomask to expose the photoresist. Photoresist is light sensitive to ultraviolet light (UV). The exposed part of the PR remains, and the unexposed PR is dissolved away when the PR is developed, much like a photographic film development. PR protects the material under it, such that an etching process removes only the unprotected part of the deposited material. Essentially, the pattern on the photomask is transferred to the thin film of desired material.

This process of depositing and patterning a series of thin film of material continues until a functional thin film circuit or thin film transistor (TFT) is completed. The substrate coated with various thin film material may also go through a series of treatments, including chemical, thermal, plasma or electrical processes during the course of fabrication. TFT fabrication process is in many ways similar to the Integrated Circuit (IC) fabrication techniques, such as Complementary Metal Oxide Semiconductor (CMOS) processes. However, the lateral dimensions involved in TFT processes have been in the order of micro meters (um) whereas in the order of nano meters (nm) is typical for CMOS processes. The film thickness, however, can be as thin as 10's of nm for a TFT process, comparable to CMOS processes.

Photolithography techniques that depend on a PR has several flavors. The first one described earlier uses a positive PR followed by an etching process to complete the patterning of the thin film. A second method would use a negative PR, where the unexposed PR remains, and the exposed PR is removed when PR is developed. Therefore, the patterning of the thin film material would be a negative photo image of what was on the photomask. Another technique is called a liftoff process. In a liftoff process, the PR is patterned first, then the desired thin film material is deposited afterward on top. The material deposited where the PR is missing would stay. The material deposited on top of the PR would be removed when the PR is removed or lifted off. A liftoff process can be combined with a positive PR or a negative PR, therefore there are 4 distinct ways to pattern a thin film of material.

Most photolithography uses PR that is UV sensitive. A photomask, often times a patterned chrome on a borosilica glass or quartz substrate, blocks or passes the UV light depending on the pattern. Usually the exposure arrangement is vertical, starting from the substrate glass, one or more already deposited and patterned layers of material, a photoresist (PR), a photomask, then the UV is illuminated from the top in order to expose the PR through the mask. As the layers stack up and create the desired circuit or transistor structures vertically, the topology can vary significantly across the process side, the top surface. No material can be added from the bottom, the backside of the substrate, where the substrate can be many orders of magnitude thicker than the thin film being deposited. Typical thickness of a glass wafer for this kind of process is 0.7 mm, or 700 um. Typical thickness of thin film layers in a TFT process is 10 to 100 nm. The photoresist can be as high (thick) as 1 to 2 um. A UV wavelength the photoresist is sensitive to is typically between 350 to 450 nm.

Since multiple layers must be deposited and patterned to form a circuit or a transistor, a small number of photomasks must be used, typically 3 to 5 masks for a TFT fabrication. Each mask goes through a registration process, where the new mask is aligned on top of an already patterned layer on the substrate before exposing the photoresist. A typical alignment error can be as small as 0.1 um and as large as 1 um given a critical dimension CD (minimum line width) of 2 um often used in TFT fabrication. Sometimes the alignment error can cause the degradation of the TFT performance or uniformity issues between TFT devices.

In addition to the alignment error, a fabrication error can cause the dimension of the fabricated pattern to deviate from the design. Sometimes the line width can be narrower or wider than the pattern on the photomask. The range of error can be similar to the mask registration error, with similar consequences. A careful and creative process engineering is required to keep the deviation under control.

With the present invention, Back Side Exposed (BSE) fabrication techniques can be used to fabricate vertical TFTs which advantageously allow for self-aligning of the critical layers, especially the gate electrode, where the precise registration between the layers can be better controlled than possible by aligning multiple masks. This also reduces the number of masks needed to fabricate the TFT, saving time and cost. A precise alignment of the critical layers can also lead to other benefits, such as lower parasitic capacitance between the layers, faster device operation, higher current, better device to device uniformity, etc.

The apparatus and methods of the present invention provide the foregoing and other advantages.

SUMMARY OF THE INVENTION

The present invention relates to a vertical-structure type thin film transistor (TFT) having a gate electrode structure adapted to allow the flow of electrons therethrough, which provides a high current drain current and low operation voltage.

In one example embodiment of the present invention, a vertical TFT is provided. The vertical TFT may comprise a source electrode and a drain electrode, the drain electrode and the source electrode being positioned on vertically separated planes. A semiconductor layer may be arranged in between the source electrode and the drain electrode. At least one gate electrode is embedded in the semiconductor layer. At least one of the source electrode and the drain electrode comprise patterned electrodes.

In one example embodiment, both the source electrode and the drain electrode comprise patterned electrodes. The source electrode may comprise a first comb-like structure comprising one or more electrically connected fingers. The drain electrode may comprise a second comb-like structure comprising one or more electrically connected fingers.

In a further example embodiment, the at least one gate electrode may also comprise a patterned electrode. For example, the at least one gate electrode may comprise a third comb-like structure comprising one or more electrically connected fingers.

The at least one gate electrode may comprise a first gate electrode and a second gate electrode arranged vertically above the first gate electrode. The one or more fingers of the first gate electrode may be at least partially offset horizontally from the one or more fingers of the second gate electrode.

The one or more fingers of the first gate electrode may be at least partially offset horizontally from the one or more fingers of the source electrode.

The one or more fingers of the first gate electrode may be insulated from the semiconductor layer by an insulator. The insulator of each of the one or more fingers of the first gate electrode may be in contact with a corresponding one of the one or more fingers of source electrode over at least a portion of a length of the one or more fingers of the first gate electrode.

In a further example embodiment, the one or more fingers of the first gate electrode may be arranged between the one or more fingers of the source electrode.

The one or more fingers of the second gate electrode may be at least partially offset horizontally from the one or more fingers of the drain electrode.

The one or more fingers of the second gate electrode may be insulated from the semiconductor layer by an insulator. The insulator of each of the one or more fingers of the second gate electrode may be in contact with a corresponding one of the one or more fingers of the drain electrode over at least a portion of a length of one or more fingers of the second gate electrode.

In a further example embodiment, the one or more fingers of the second gate electrode may be arranged between the one or more fingers of the drain electrode.

In a further example embodiment, the first gate electrode may be positioned on the same horizontal plane as the source electrode. In addition, the second gate electrode may be positioned on the same horizontal plane as the drain electrode.

Each of the source electrode and the drain electrode may comprise patterned electrodes. Each of the at least one gate electrode may comprise an additional patterned electrode. Each of the patterned electrodes and additional patterned electrodes may comprise substantially identical patterns. The substantially identical patterns may comprise one of micro perforations, a mesh structure, a lattice structure, a comb-like structure, or the like.

In example embodiments where the at least one gate electrode is insulated from the semiconductor layer by an insulator, the insulator may be formed by oxidation of the gate electrode via one of thermal annealing, joules heating, and an electric field assisted annealing process.

In addition, one or more of the source electrode, the drain electrode, and the at least one gate electrode may be formed via a back side exposed fabrication technique.

In a further example embodiment, the at least one gate electrode may comprise a single gate electrode embedded in the semiconductor layer between the source electrode and the drain electrode. The single gate electrode is a patterned electrode which is positioned to allow a flow of electrons to pass between the source electrode and the drain electrode.

The source electrode may be a patterned electrode which comprises a first comb-like structure comprising one or more electrically connected fingers. The drain electrode may be a patterned electrode which comprises a second comb-like structure comprising one or more electrically connected fingers. The patterned gate electrode may comprise a third comb-like structure comprising one or more electrically connected fingers. The one or more fingers of the gate electrode, the one or more fingers of the source electrode, and the one or more fingers of the drain electrode may all be vertically aligned.

BRIEF DESCRIPTION OF THE DRAWINGS

The present invention will hereinafter be described in conjunction with the appended drawing figures, wherein like reference numerals denote like elements, and:

FIG. 15A shows an example embodiment of a Type I oxide-VTFT structure with a staggered overlapping two gates in accordance with the present invention;

FIG. 15B shows an example embodiment of a Type II oxide-VTFT structure with a single micro perforated gate in accordance with the present invention;

FIG. 15C shows an example embodiment of a Type III oxide-VTFT structure with two gates with comb structure in accordance with the present invention;

FIG. 15D shows an example embodiment of a prior art oxide-LTFT structure with a single bottom gate in accordance with the present invention;

FIG. 17A shows a conventional prior art photolithographic patterning process prior to the start of a BSE (Back Side Exposed) process;

FIG. 17B shows an example BSE patterning process using a negative photoresist in accordance with an example embodiment of the present invention;

FIG. 17C shows an example BSE patterning process using a positive photoresist in accordance with an example embodiment of the present invention;

FIG. 18A shows an example embodiment of a micro perforated gate VTFT Type II, in an off state, in accordance with the present invention;

FIG. 18B shows an example embodiment of a multi finger VTFT Type II with a comb like electrodes, in an off state, in accordance with the present invention;

FIG. 18C shows an example embodiment of a single finger VTFT Type II, in an off state, in accordance with the present invention;

FIG. 18D shows an example embodiment of a micro perforated gate VTFT Type II, in an on state;

FIG. 18E shows an example embodiment of a multi finger VTFT Type II with a comb like electrodes, in an on state, in accordance with the present invention;

FIG. 18F shows an example embodiment of a single finger VTFT Type II, in an on state, in accordance with the present invention;

DETAILED DESCRIPTION

Figure 1A:
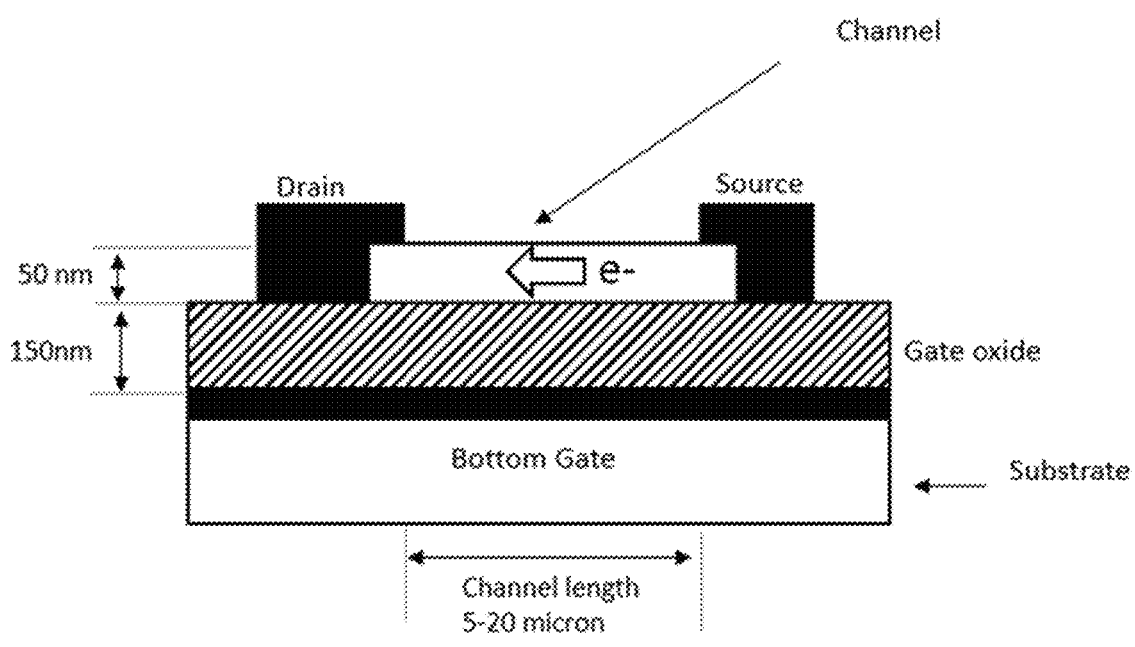
FIG. 1A shows an example embodiment of a prior art oxide-TFT structure with a lateral active channel having a bottom gate structure.
Figure 1B:
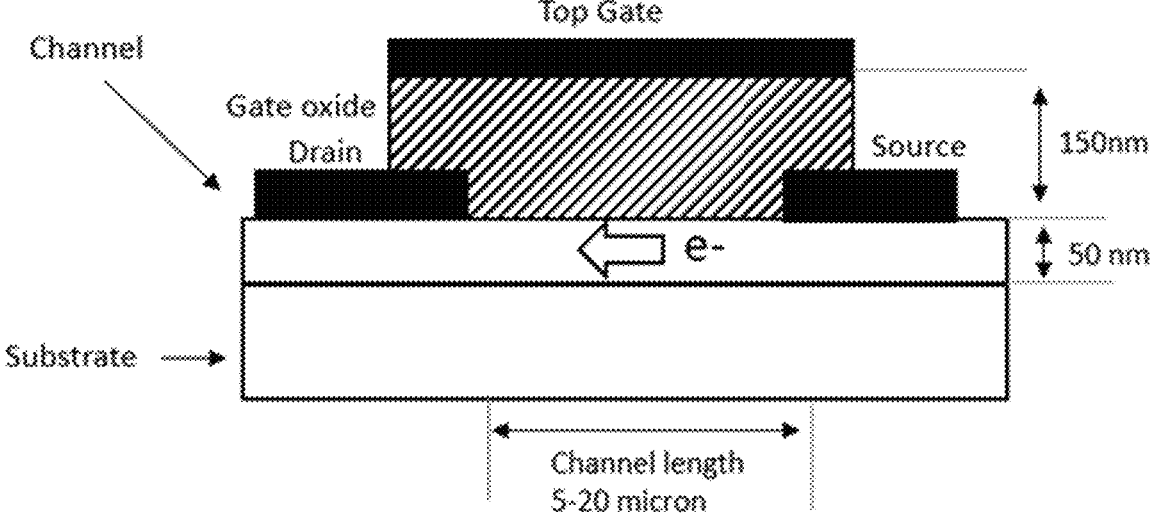
FIG. 1B shows an example embodiment of a prior art oxide-TFT structure with a lateral active channel having a top-gate structure.

The ensuing detailed description provides exemplary embodiments only, and is not intended to limit the scope, applicability, or configuration of the invention. Rather, the ensuing detailed description of the exemplary embodiments will provide those skilled in the art with an enabling description for implementing an embodiment of the invention. It should be understood that various changes may be made in the function and arrangement of elements without departing from the spirit and scope of the invention as set forth in the appended claims.

The present invention relates to a vertical-type thin film transistor (TFT) having a gate electrode structure adapted to allow the flow of electrons therethrough, which provides a high current drain current ($I_{DS}$>0.1 A) and low operation voltage ($V_{th}$<1.5V). Corresponding methods of producing such a vertical-type thin film transistor are also provided. For example, one embodiment may comprise a vertical-structure type TFT using a wide band gap oxide semiconductor channel including amorphous/crystalline materials and a gate electrode structure adapted to allow the flow of electrons therethrough (such as a perforated or comb-like structure), which provides a high current drain current ($I_{DS}$>0.1 A) and low operation voltage ($V_{th}$<1.5V).

Although the present invention is described herein in relation to an enhancement mode type transistor, those skilled in the art will appreciate that the vertical structure disclosed herein may be used in a depletion mode type transistor by changing device parameters such as the turn on threshold voltage. Further, the vertical structure of the present invention may be used to implement different types of transistor structures, including non-TFT structures.

The present invention involves controlling the current carriers between the source and the drain that are arranged vertically one above the other. Basically, the current will flow between 2-D sheets of source and drain contacts, where the semiconducting material is sandwiched between the vertically arranged source and the drain contacts. This results in a 3-D volume of current carrying electrons (or holes) flowing from the source electrode to the drain electrode between the structure of the gate electrodes, thereby increasing the total current that can be switched. Since the current flow is vertical and over a shorter distance, high current is achieved. Also, the switching on-resistance decreases and the transistor switching time is reduced, resulting in a fast, high current handling transistor.

It should be appreciated that the term "electrons" is synonymous with the term "current carriers" as used herein, which is typical of N-type semiconductors. Those skilled in the art should appreciate that if a P-type semiconductor is involved, the current would be carried by holes. In a popular TFT design, the semiconductor material can be Silicon, such as amorphous Si and poly-Si or an oxide semiconductor material, such as IGZO (Indium Gallium Zinc Oxide), which typically form N-type channels. In an organic TFT, the semiconducting material is more often a P-type material. An intrinsic semiconductor, such as undoped Silicon, has an approximately equal number of electrons and holes present as current carriers. It should be understood that the present invention applies equally well to all semiconducting materials, even though the present disclosure primarily discusses using electrons as the current carrier.

It should also be understood that the vertical transistor structure disclosed herein equally applies to other transistor designs that are not constructed using the TFT process, such as CMOS processes that start with bulk substrates.

Figure 2A:
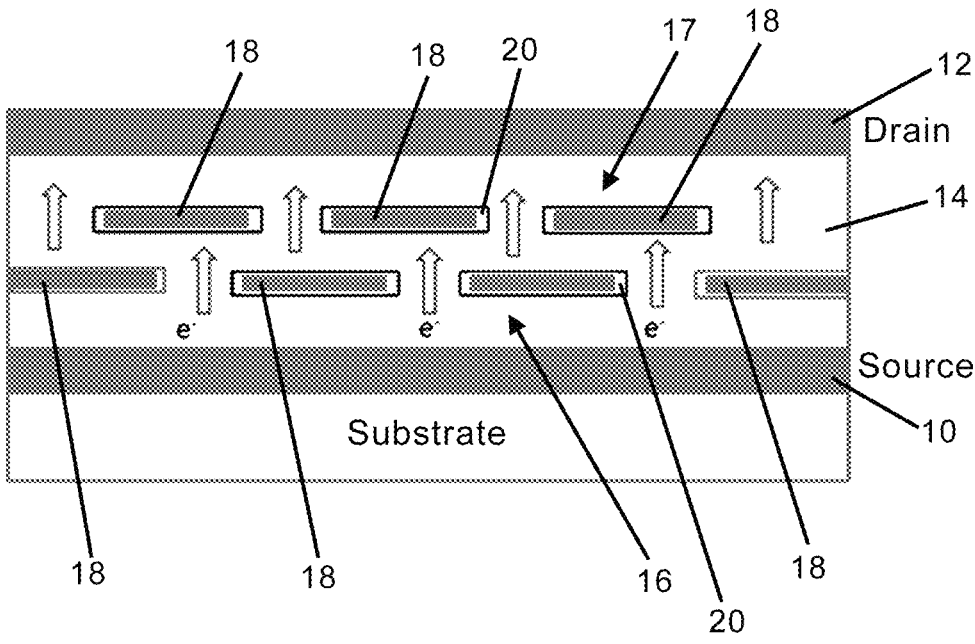
FIGS. 2A and 2B show an example embodiment of a vertical TFT structure in accordance with the present invention.
Figure 2B:
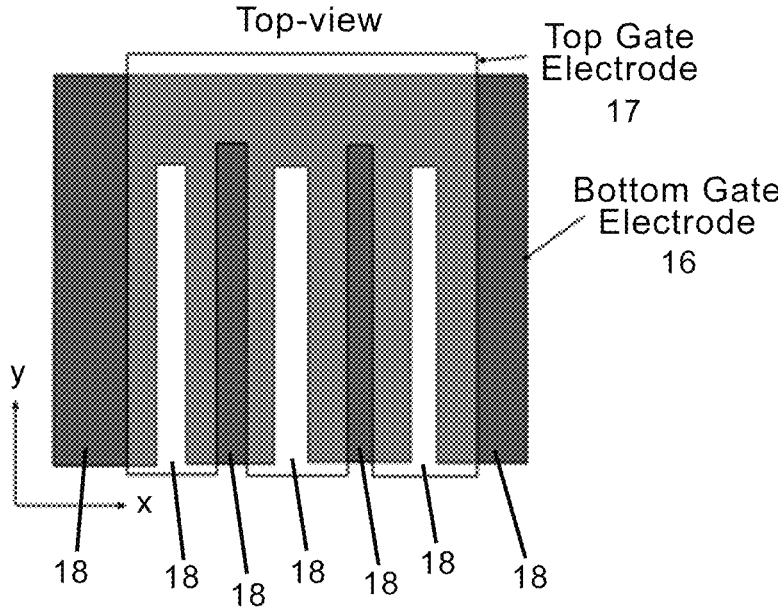

One aspect of the present invention is the use of embedded gate electrodes within the semiconductor material. An example embodiment of a vertical TFT structure in accordance with the present invention is shown in FIGS. 2A and 2B. A source electrode 10 and a drain electrode 12 extend parallel to one another, with the source electrode 10 below the drain electrode 12. A semiconductor layer 14 is arranged between the source electrode 10 and the drain electrode 12. Two or more layers of gate electrodes (e.g., first gate electrode 16 (also referred to herein as the bottom gate electrode) and second gate electrode 17 (also referred to herein as the top gate electrode)) are embedded in the semiconductor layer 14 between and parallel to the source electrode 10 and the drain electrode 12. Each of the two or more gate electrodes 16, 17 comprise a structure adapted to allow the flow of electrons therethrough.

Each gate electrode 16, 17 may be perforated, or have a mesh, gate, lattice, or comb-like structure to let electrons flow between the elements of the structure itself. The present invention encompasses any gate electrode structure that allows the flow of electrons between and/or around the elements of the structure. Accordingly, although various embodiments of the present invention are discussed below as employing a comb-like gate electrode structure (also referred to herein as "comb-gate electrodes"), the present invention encompasses any type of gate electrode structure that allows the flow of electrons through the structure itself, such as a mesh structure, a perforated structure, a lattice structure, an offset structure, or any similar structure that permits the flow of electrons therethrough, as will be described in more detail below.

Figure 3A:
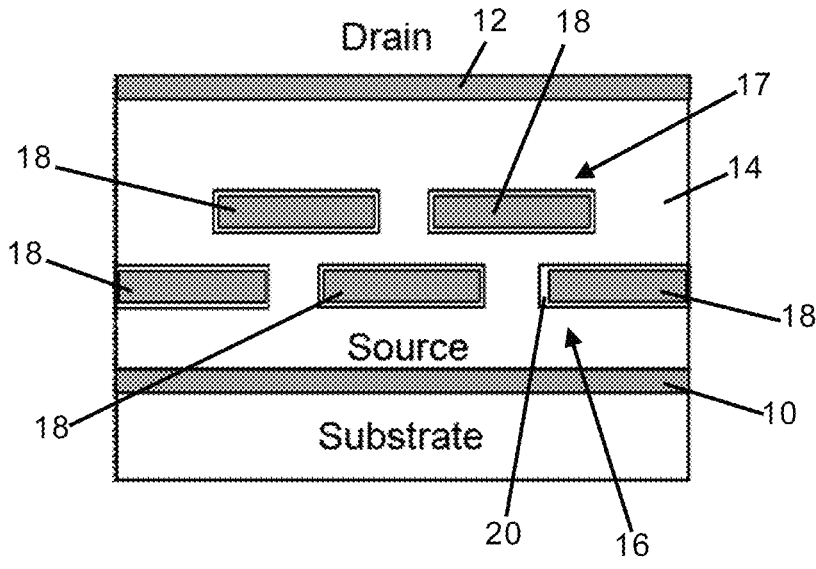
FIGS. 3A, 3B, and 3C show a further example embodiment of a vertical TFT structure in accordance with the present invention.
Figure 3B:
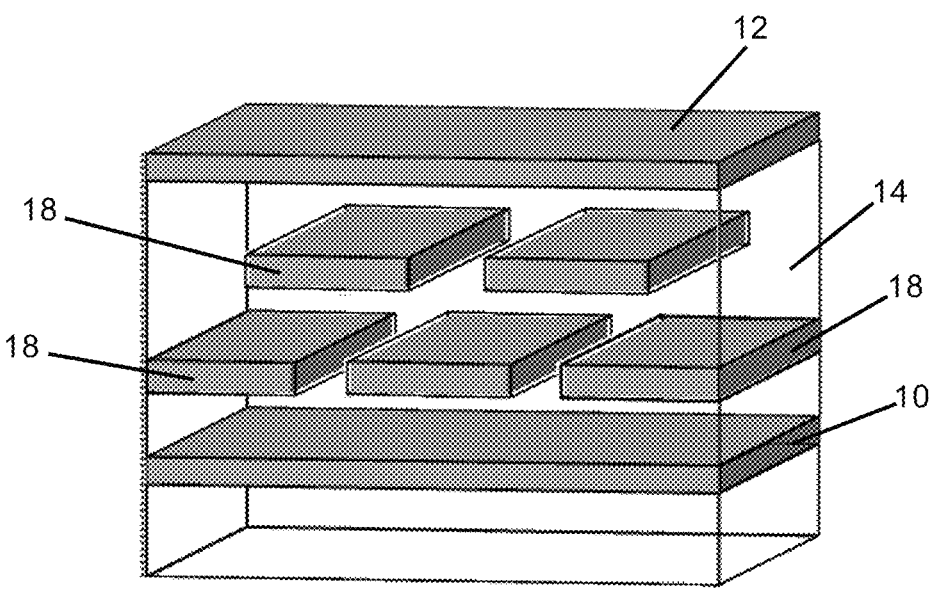
Figure 3C:
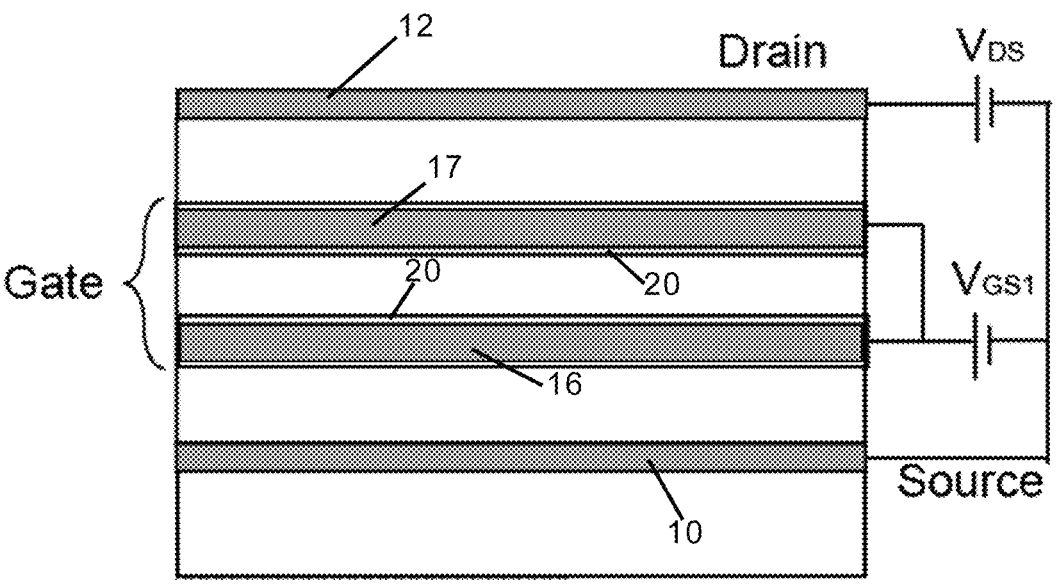

In an embodiment comprising a comb-like gate electrode structure as shown in FIGS. 2A and 2B, the combs 18 of adjacent gate electrodes 16, 17 are offset from one another such that, for example, the combs 18 of the one gate electrode are aligned with the spaces between the combs of an adjacent gate electrode and vice versa, as shown in FIG. 2B. This arrangement blocks a direct electric field between the source electrode 10 and the drain electrode 12 by preventing a direct path from the source to the drain for the electrons. This prevents the device from turning on inadvertently. When the gate voltage Vgs1 between the source electrode 10 and the first gate electrode 16 is below Vth, the turn on voltage, the transistor stays turned off regardless of the drain voltage. When the gate voltage Vgs1 exceeds the turn on voltage Vth, the carrier electrons are generated within the semiconductor layer 14 and the electrons flow between the combs 18, past the second gate electrode 17, and flow to the drain electrode 12, thereby turning on the transistor. The gate voltage Vgs2 of the second gate electrode 17 can be tied to the first gate electrode 16 for this purpose, applying the same voltage to each gate electrode 16, 17. FIGS. 3A-3C show a further example of a comb gate electrode configuration in a vertical TFT structure in accordance with the present invention where the same voltage is applied to both gate electrodes 16, 17.

Figure 4A:
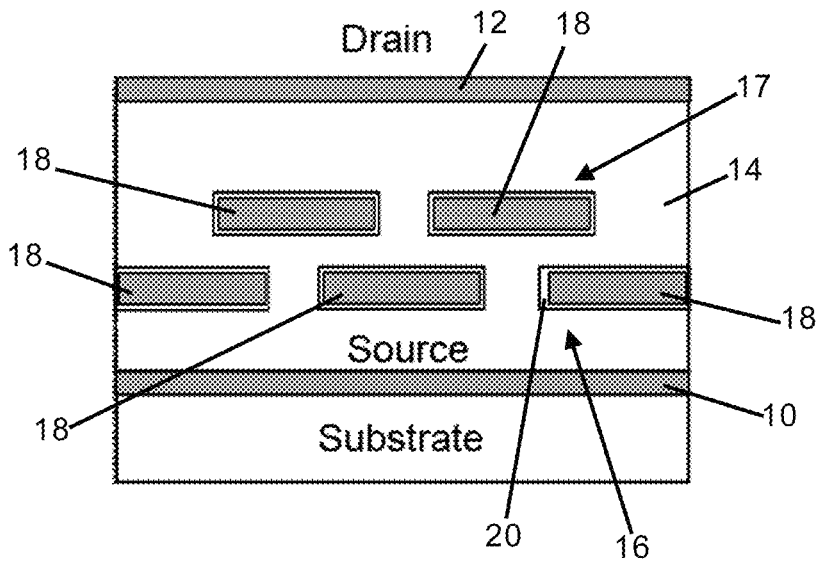
FIGS. 4A, 4B, and 4C show a further example embodiment of a vertical TFT structure in accordance with the present invention.
Figure 4B:
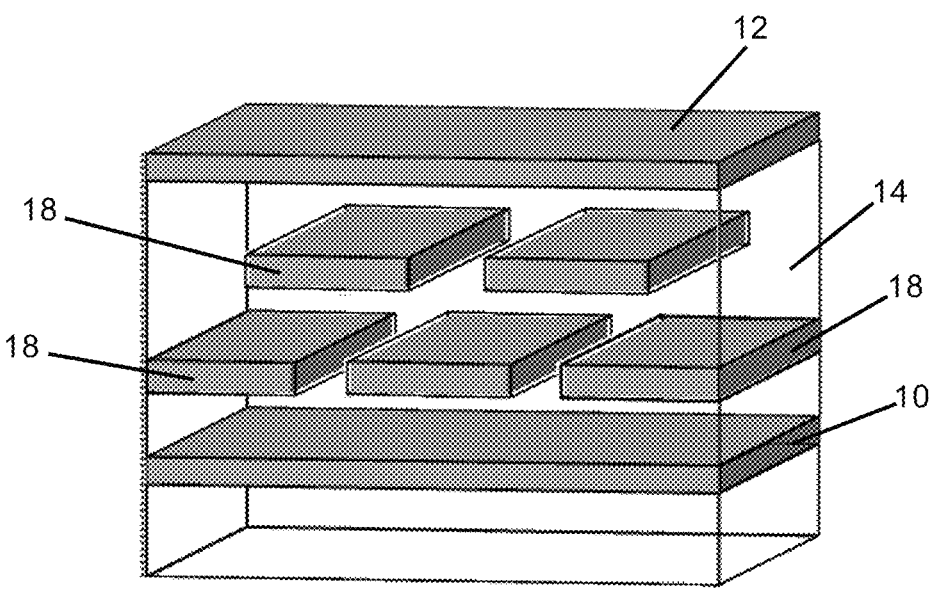
Figure 4C:
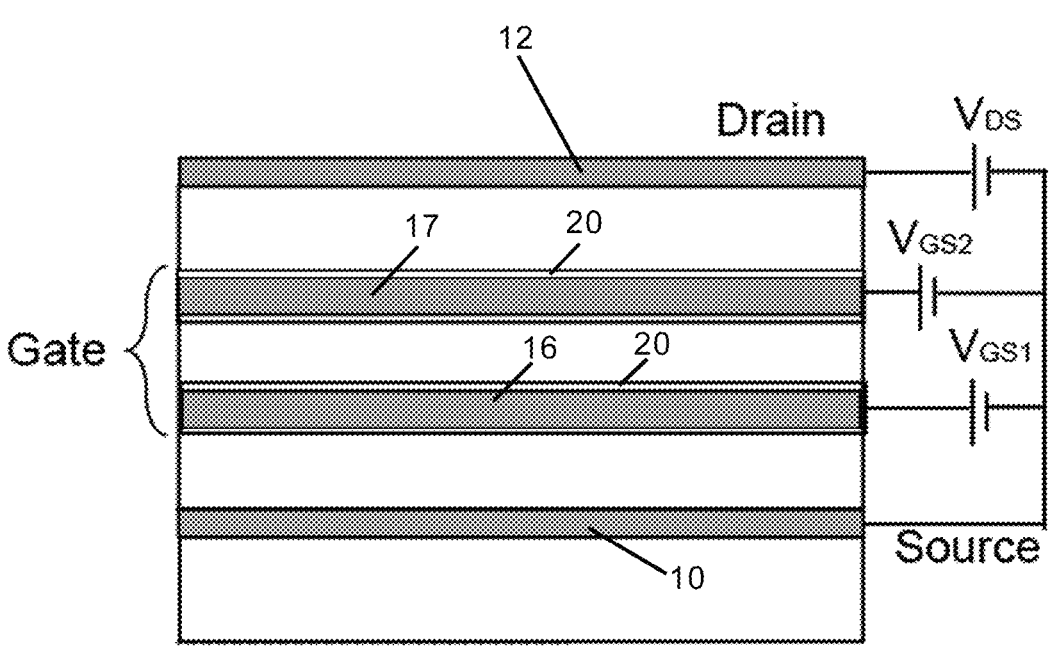

However, an independent control of the Vgs1 and Vgs2 may lead to other modes of operation for the same transistor device. For example, when an intrinsic semiconductor is used as the channel, a sufficient voltage difference between Vgs1 and Vgs2 would generate carrier electrons and holes in the semiconductor layer 14 around the two gate electrodes 16, 17, which would turn the transistor on. FIGS. 4A-4C shows an example of a comb gate electrode configuration in a vertical TFT structure in accordance with the present invention having a dual gate electrode structure where Vgs1 and Vgs2 are controlled independently. As shown in FIGS. 3C and 4C, the comb gate electrodes 16, 17 may be connected at the outside of semiconductor channel 14.

A gap between a first gate electrode 16 of the two or more gate electrodes and the source electrode 10 may be of a different dimension than a gap between a second gate electrode 17 of the two or more gate electrodes and the drain electrode 12. For example, it should be noted that the placement of the first gate electrode 16 closer to the source electrode 10 can sometimes be preferable, in order to reduce the turn on voltage Vth. The gap between the second gate electrode 17 and the drain electrode 12 can be increased to handle high drain voltage without breakdown. The combined effect would produce a high voltage handling transistor without having to increase the turn on voltage. Of course, the size or area of the source and the drain electrodes would increase the total current that can be switched. Therefore, various choices of the dimensions of this TFT would lead to different optimizations for various applications.

It should also be noted that both the first gate electrode 16 and the second gate electrode 17 (or more if present) should be sufficiently insulated from the semiconductor material by an insulator 20 so that no current flows in and out of the gate. The thickness of this insulator 20, which may be an oxide or a nitride, need not be very thick. For example, the thermal oxide that naturally forms around an aluminum gate electrode may be sufficient to insulate the gate electrode 16, 17 from the semiconductor material.

One example embodiment may employ a metal-oxide-semiconductor (MOS) structure. A wide bandgap metal oxide semiconductor channel may include crystal, poly-crystal, micro-crystal, Nano-crystal, polymorphous, or amorphous forms. The semiconductor channel may also include a monoxide (such as ZnO, SnO, In2O3, Ga2O3, etc.) and multicomponent forms including binary systems (In—Zn—O (IZO), Sn—Zn—O (TZO), Ga—Zn—O (GZO), etc.), ternary systems (In—Ga—Zn—O (IGZO), In—Al—Zn—O (IAZO), Sn—Ga—Zn—O (TGZO) and more (In—Sn—Ga—ZnO (ITGZO) and In—Sn—Al—ZnO (ITAZO), etc.). Additionally, several combinations of Gate/gate oxides can be used such as $Si/SiO_2$, $Al/Al_2O_3$, $Ti/TiO_x$, Mo/MoOx and the like.

In accordance with such an example embodiment, the MOS structure may be provided with vertically stacked built-in gate electrodes. To achieve a high drain current, a short vertical channel (typically 10-200 nm) is preferable. Such a TFT operates with a gate bias of less than 3V and controls a high drain current in the order of amps, many orders of magnitude higher than a lateral transistor of a comparable size. However, the present invention may be implemented with a vertical active channel of the semiconductor layer having a length between 10 nm-5 um and a channel width of between 1 um-10 mm.

The comb gate/gate oxide configuration built into the active layer enables the control of current flow effectively and can achieve a low off current (<fA) and a large on/off current ratio.

The example embodiment of a vertical TFT shown in FIGS. 2A and 2B comprises two built-in gate electrodes 16, 17 in a comb gate/gate oxide configuration, one comb gate electrode being arranged above the other comb gate electrode. In such a configuration, electrons move from the bottom (source electrode 10) to the top (drain electrode 12). The active channel is vertical with a length of about 100-200 nm. The gate electrodes 16, 17 are arranged inside of the active channel region. The lateral dimension (i.e. channel width) depends on the number of comb gate electrode configurations, which is not limited. The range of a typical lateral dimension may be about 10-20 um.

However, the present invention may be implemented using only one layer of comb gate electrode, two comb gate electrodes as shown in FIGS. 2A-4C, or more layers of comb gate electrodes. Further, the present invention may be implemented with an offset gate structure, where one solid gate electrode is offset from an adjacent solid gate electrode, blocking a direct path for current flow from the source to the drain.

In a further example embodiment, a vertical channel TFT with a-In—Ga—Zn—O (a-IGZO) channels and Al/AlOx gate structure may be provided. The TFT structure can be fabricated on various materials including glass, plastics, ceramics, and the like. An amorphous In—Ga—Zn—O (a-IGZO) channel may be prepared by a physical vapor deposition (PVD) process such as sputtering or a solution process such as inkjet or a sol-gel process. Also, the aluminum gate electrode(s) may be prepared by a PVD method or a solution process. The aluminum oxide gate insulator may be formed by post-thermal annealing. The typical annealing temperature may be about 150-250° C. and the annealing time may be about 0.5-1 hr. The typical gate oxide thickness may be about 5-10 nm. The channel length (i.e. the distance between the source and drain) and the channel width are approximately 200 nm and 10 um, respectively. The device turns on at low voltage which is about at $V_{GS}<1V$. When the $V_{GS}$ is applied over 10V, the $I_{DS}$ reaches a very high current over 1 A. The On/Off ratio is estimated to be over 10 orders of magnitude.

Figure 5:
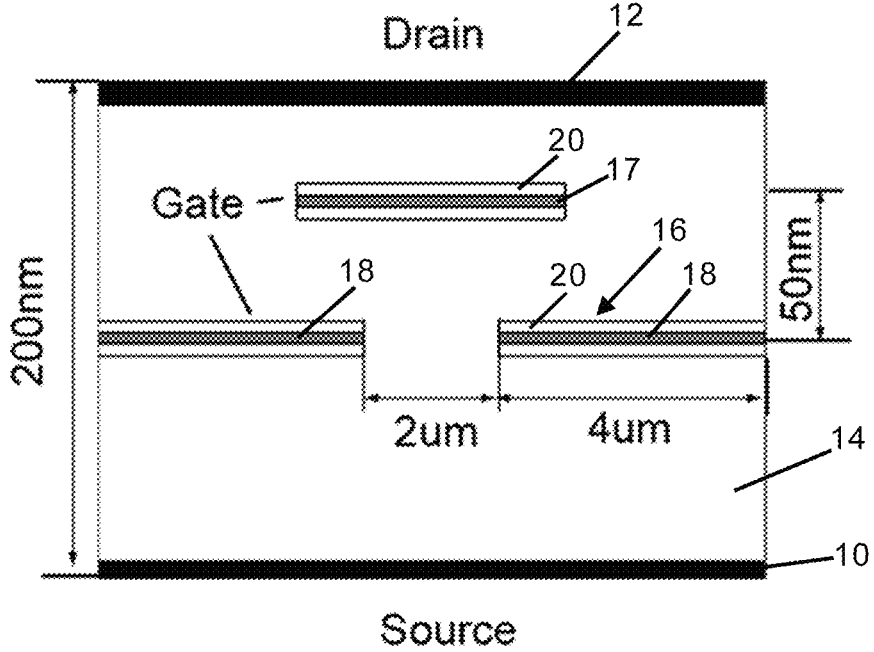
FIG. 5 shows a further example embodiment of a vertical TFT structure in accordance with the present invention.
Figure 6:
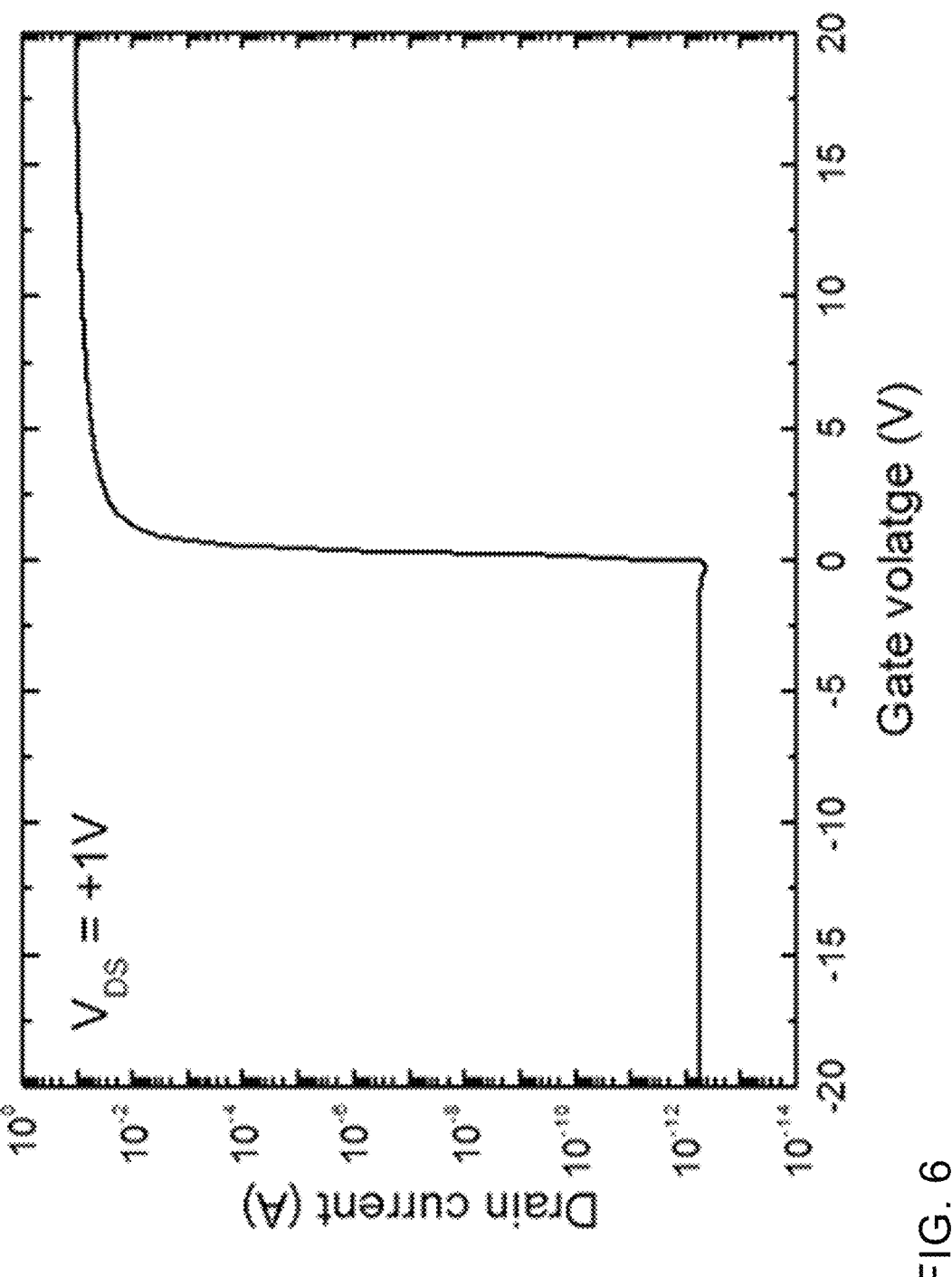
FIG. 6 shows a simulated Ids-Vgs curve at Vds=1V for the vertical TFT structure of FIG. 5.

FIG. 5 is a schematic illustration of a Vertical TFT structure model in accordance with an example embodiment of the present invention. The FIG. 5 TFT shows a dual gate electrode structure where only the bottom gate electrode 16 is a comb-gate electrode with combs 18. FIG. 6 shows a simulated Ids-Vgs curve at Vds=1V for the Vertical TFT structure of FIG. 5, with a-In—Ga—Zn—O (a-IGZO) channels. Similar results can be achieved where both the first and second gate electrodes 16, 17 are comb-gate electrodes, or where there are more than two gate electrodes.

Figure 7B:
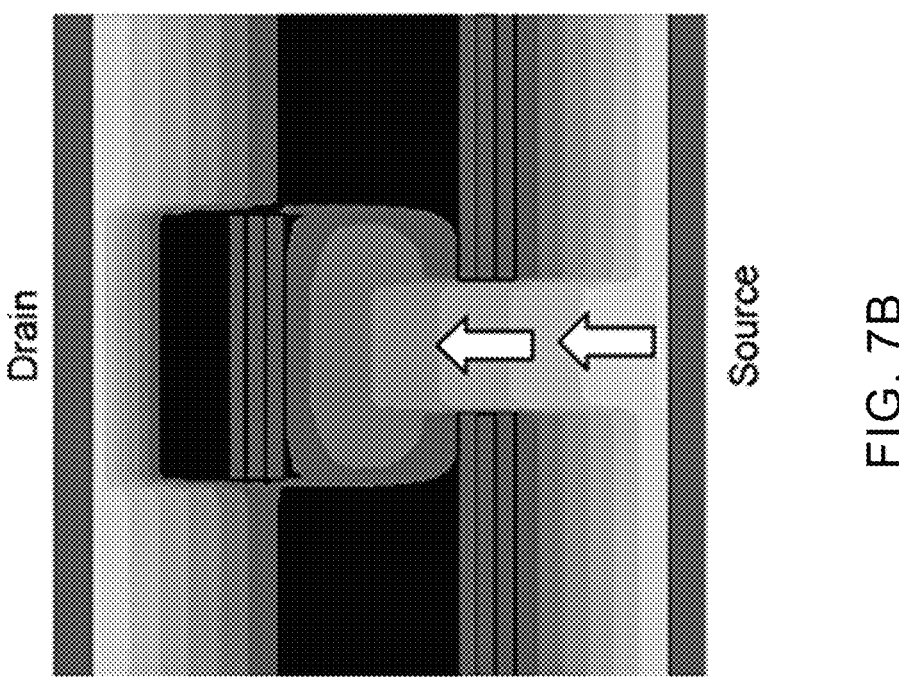
FIG. 7B shows a contour map of electron density and electron flow that is blocked in the OFF state for the vertical TFT structure of FIG. 5.
Figure 7A:
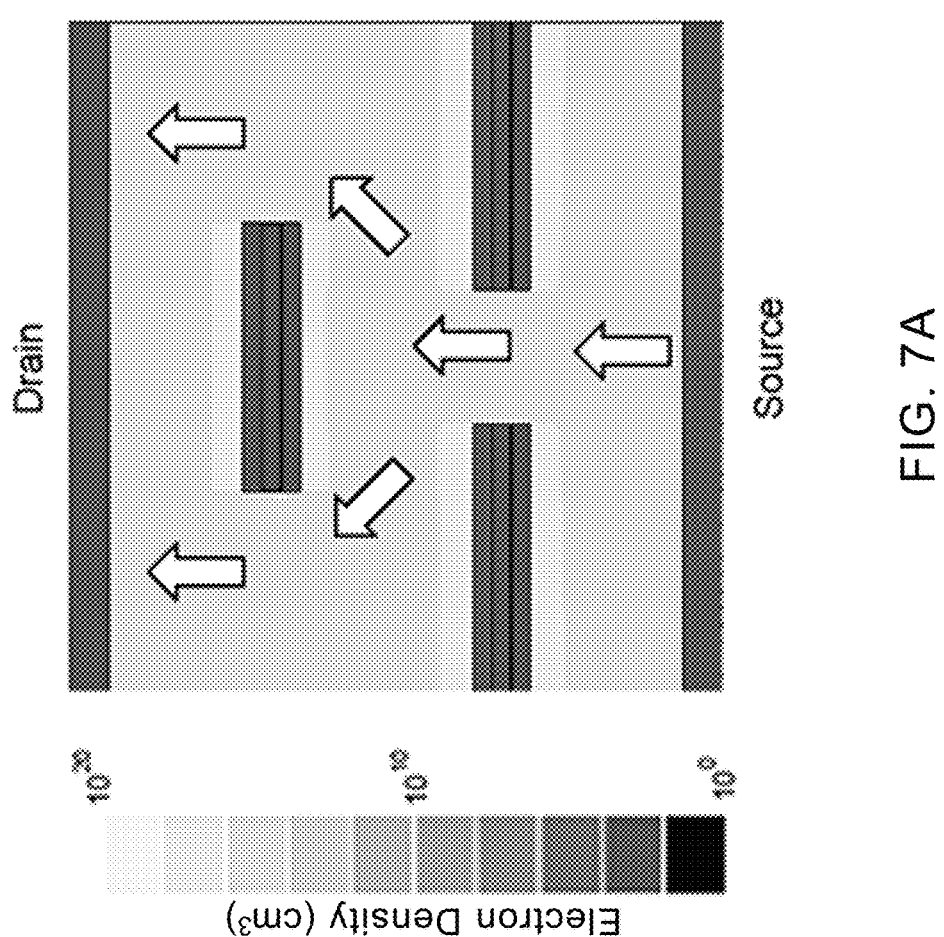
FIG. 7A shows a contour map of electron density and electron flow at a gate voltage in the ON state for the vertical TFT structure of FIG. 5.

FIG. 7A shows a contour map of electron density ($10$-$10^{20}$ $cm^{-3}$) and electron flow at a gate voltage in the ON state (+20V) and FIG. 7B shows a contour map of electron density and electron flow that is blocked in the OFF State (−20V) for a Vertical TFT with a-In—Ga—Zn—O (a-IGZO) channels in accordance with the present invention. A high carrier accumulation region with $10^{19}$ $cm^{-3}$ is generated in these comb gate electrodes by a positive gate bias with 20V. In this case, high current flow from drain to source electrode is achieved. In contrast, the depletion region with a carrier density of about $<10^{10}$ $cm^{-3}$ is formed when the gate voltage is −20V. Therefore, current flow is well suppressed at the gap in a comb-gate electrode and is very low level (<fA).

Figure 8A:
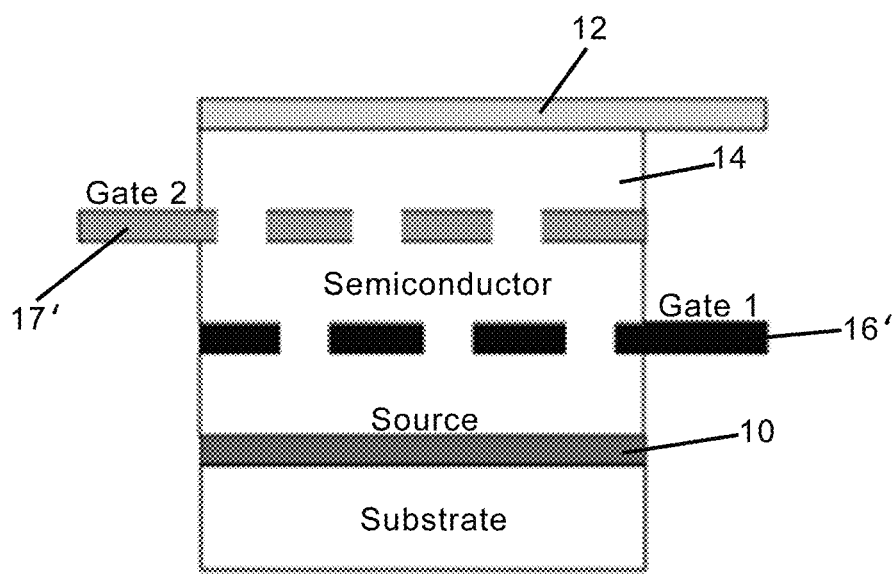
FIGS. 8A and 8B show a further example embodiment of a vertical TFT structure in accordance with the present invention.
Figure 8B:
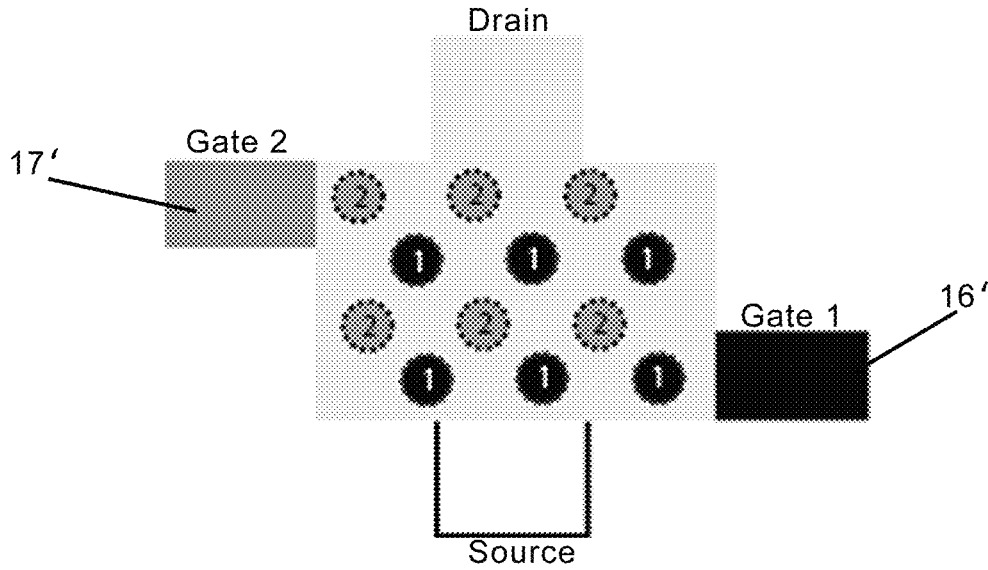

FIGS. 8A and 8B show a further example embodiment of a vertical TFT structure where, instead of the gate electrodes having a comb-like structure, the gate electrodes 16' and 17' have a perforated structure. Such a perforated structure may comprise round holes as shown in FIG. 8B in each gate electrode 16', 17'. Alternatively, similar results may be achieved using square holes or a lattice type structure. Regardless of the configuration of the perforations, the perforations of one gate electrode will be offset from the perforations of the adjacent gate electrode. FIGS. 8A and 8B show the holes 1 of the first gate electrode 16' offset from the holes 2 of the second gate electrode 17'. This arrangement blocks a direct flow of electrons from the source to the drain. The holes may be on the order of 1 um.

Figure 9:
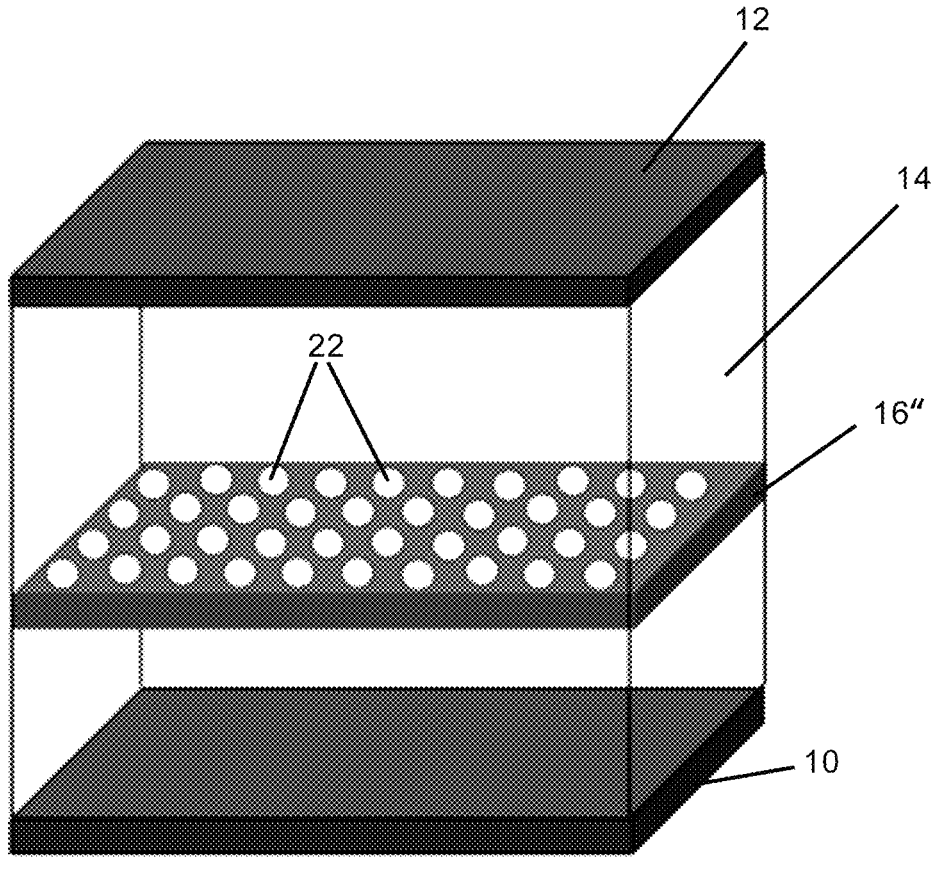
FIG. 9 shows an example embodiment of a vertical TFT with a single gate structure in accordance with the present invention.

FIG. 9 shows a further example embodiment of a vertical TFT in accordance with the present invention having only one gate electrode 16'' embedded in the semiconductor layer 14 and arranged between the source electrode 10 and the drain electrode 12. The single gate electrode may comprise micro-perforations 22 configured to control the flow of electrons therethrough in dependence on a predetermined voltage difference between the source electrode and the single gate electrode.

The gate electrode 16″ may be formed using one of a CMOS fabrication method, e-beam lithography, and laser lithography. The micro-perforations 22 may be formed due to one of a property of a material of the gate electrode, a property of a material mixed with the material of the gate electrode, a deposition method, a curing method, or an annealing method. For example, a material that is easily oxidized can be mixed with the gate material, such that during the fabrication process the material is removed leaving the holes. Other possibilities for forming such a gate material with perforations exist, such as using a semiconductor material such as silicon or other suitable semiconductor material mixed in with a polymer that is removed in the fabrication process, leaving behind the perforations.

The micro-perforations 22 may have a diameter or width of approximately 1 nm-1 um and a thickness of approximately 10 nm-1 um. In such a gate electrode, the holes may be so small that the electric field between the source and the drain is masked by the single gate electrode. At a predetermined voltage difference between the gate electrode and the source voltage, the masking effect is reduced and the electrons are permitted to pass through the holes. If the gate to source voltage rises further, the rate at which the electrons pass through the perforations may increase. The predetermined voltage may be approximately negative 0.3-10 v in order to terminate electron flow in a depletion-type TFT and approximately positive 0.3-10 v in order to permit electron flow in an accumulation-type TFT.

Figure 10A:
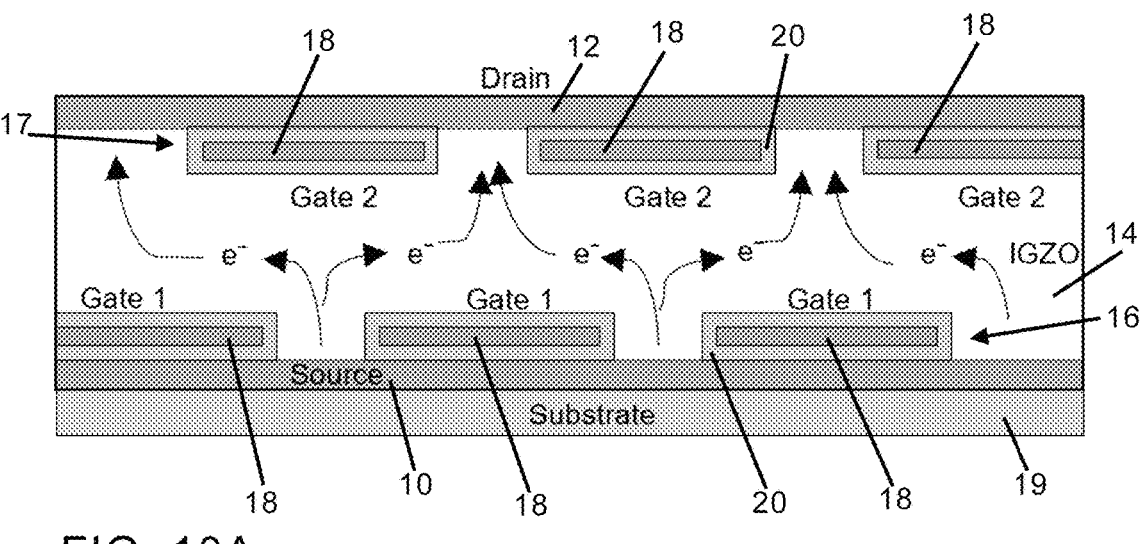
FIGS. 10A-10C show further example embodiments of a vertical TFT structure in accordance with the present invention.
Figure 10B:
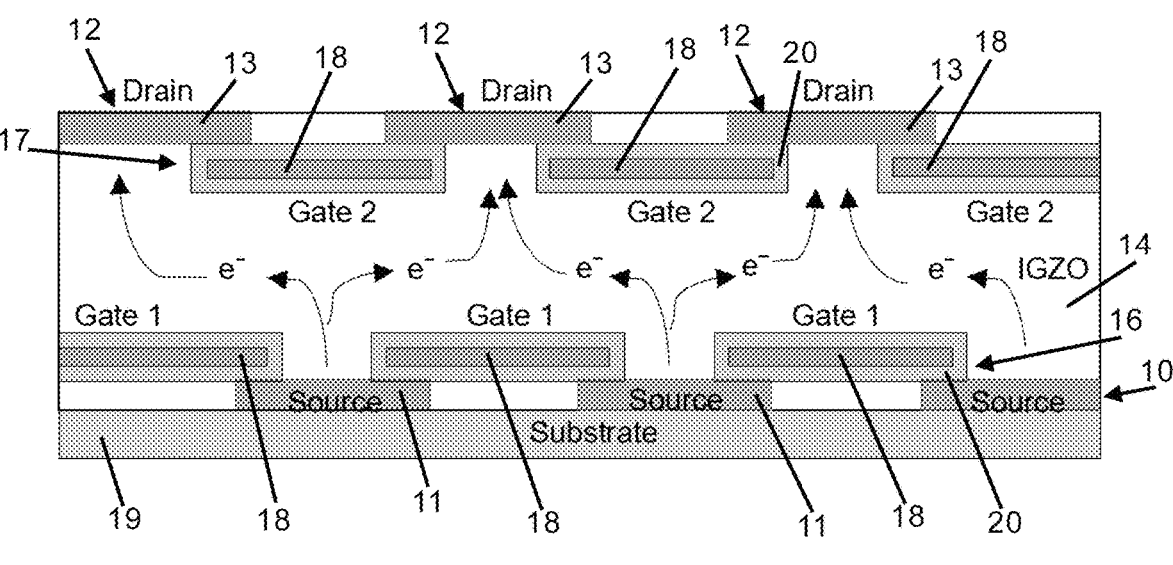
Figure 10C:
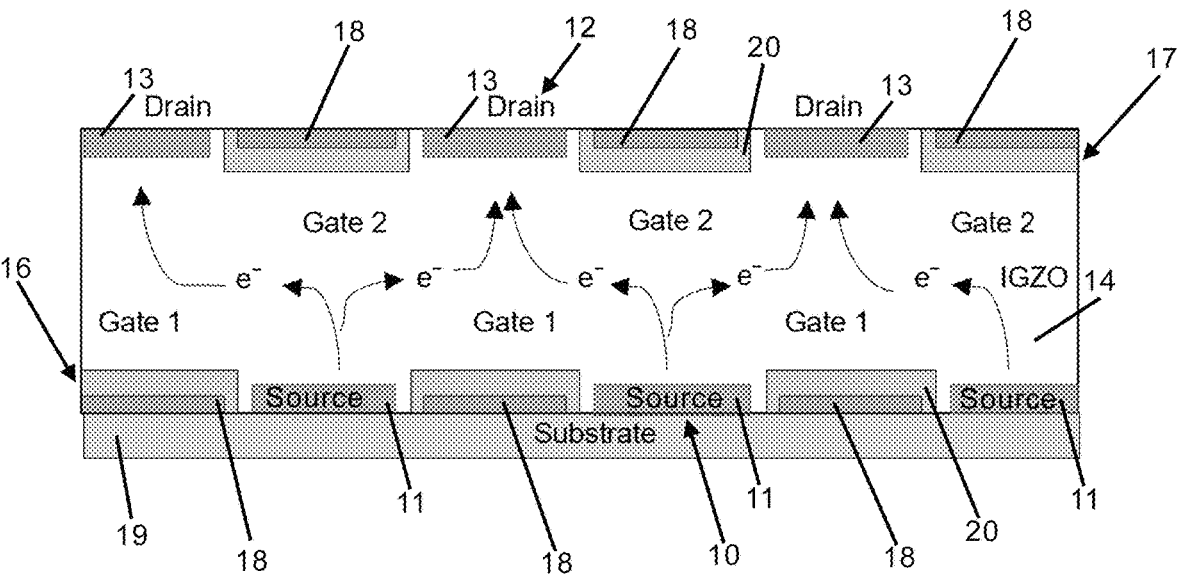

FIGS. 10A through 10C show further example embodiments of vertical TFT structures. In particular, FIGS. 10A, 10B, and 10C illustrate how the embodiments of FIGS. 2A and 3A discussed above can be simplified for various applications, resulting in easier fabrication at reduced costs. FIGS. 10A-10C show the evolution of the FIG. 2A embodiment into a more simplified structure. The FIG. 2 embodiment discussed above consists of one source electrode 10, a first gate electrode 16 with combs 18, a second gate electrode 17 with combs 18, and one drain electrode 12. The gate electrodes are encased with a gate oxide insulator 20 as discussed above. The semiconductor layer between source and drain is IGZO. Fabrication of this Type III structure requires three separate depositions of IGZO layers, one below gate 1, one between gate 1 and gate 2, and one above gate 2.

The example embodiment shown in FIG. 10A moves the gate 1 electrode 16 against the source electrode 10 and moves the gate 2 electrode 17 against the drain electrode 12. Carriers (electrons) still flow the same way as in the FIG. 2A embodiment. However, in this embodiment, only one IGZO deposition is needed.

The FIG. 10A embodiment can be further simplified by partially removing areas of the source and drain electrodes covered by the gate electrodes, as shown in the FIG. 10B structure.

Further simplifying the structure of the FIG. 10B embodiment can be achieved by removing all the areas of the source electrode 10 and drain electrode 12 covered by the gate electrodes 16, 17 as shown in FIG. 10C. In this embodiment, the gate 1 electrode 16 can be deposited along with the source electrode 10, and the gate 2 electrode 17 can be deposited along with the drain electrode 12. Carriers still flow in the same manner as in the FIG. 2A embodiment.

In particular, in the example embodiment shown in FIG. 10A, the vertical TFT may comprise a source electrode 10 and a drain electrode 12, the drain electrode 12 and the source electrode 10 being positioned on vertically separated planes. A semiconductor layer 14 may be arranged in between the source electrode 10 and the drain electrode 12. At least one gate electrode 16, 17 is embedded in the semiconductor layer 14. At least one of the source electrode 10 and the drain electrode 12 comprise patterned electrodes. The source electrode may be arranged on a substrate 19, which may be an insulator such as glass.

As shown in FIG. 10B, the source electrode 10 and the drain electrode 12 may each comprise patterned electrodes The source electrode 10 may comprise a first comb-like structure comprising one or more electrically connected fingers 11 (also referred to herein as combs). The drain electrode 12 may comprise a second comb-like structure comprising one or more electrically connected fingers 13.

In a further example embodiment, the at least one gate electrode 16, 17 may also comprise a patterned electrode. For example, the at least one gate electrode 16, 17 may comprise a third comb-like structure comprising one or more electrically connected fingers 18.

The at least one gate electrode may comprise a first gate electrode 16 and a second gate electrode 17 arranged vertically above the first gate electrode. The one or more fingers 18 of the first gate electrode 16 may be at least partially offset horizontally from the one or more fingers 18 of the second gate electrode 17.

The one or more fingers 18 of the first gate electrode 16 may be at least partially offset horizontally from the one or more fingers 11 of the source electrode 10.

The one or more fingers 18 of the first gate electrode 16 may be insulated from the semiconductor layer 14 by an insulator 20. The insulator 20 of each of the one or more fingers 18 of the first gate electrode 14 may be in contact with a corresponding one of the one or more fingers 11 of source electrode 16 over at least a portion of a length of the one or more fingers 18 of the first gate electrode.

The one or more fingers 18 of the second gate electrode 17 may be at least partially offset horizontally from the one or more fingers 13 of the drain electrode 12.

The one or more fingers 18 of the second gate electrode 17 may be insulated from the semiconductor layer by an insulator 14. The insulator 14 of each of the one or more fingers 18 of the second gate electrode 17 may be in contact with a corresponding one of the one or more fingers 13 of the drain electrode 12 over at least a portion of a length of one or more fingers 18 of the second gate electrode 17.

As shown in FIG. 10C, the one or more fingers 18 of the first gate electrode 16 may be arranged between the one or more fingers 11 of the source electrode 10. The one or more fingers 18 of the second gate electrode 17 may be arranged between the one or more fingers 13 of the drain electrode 12.

Figures 11A, 11B, 11C, 11D, 11E, 11F:
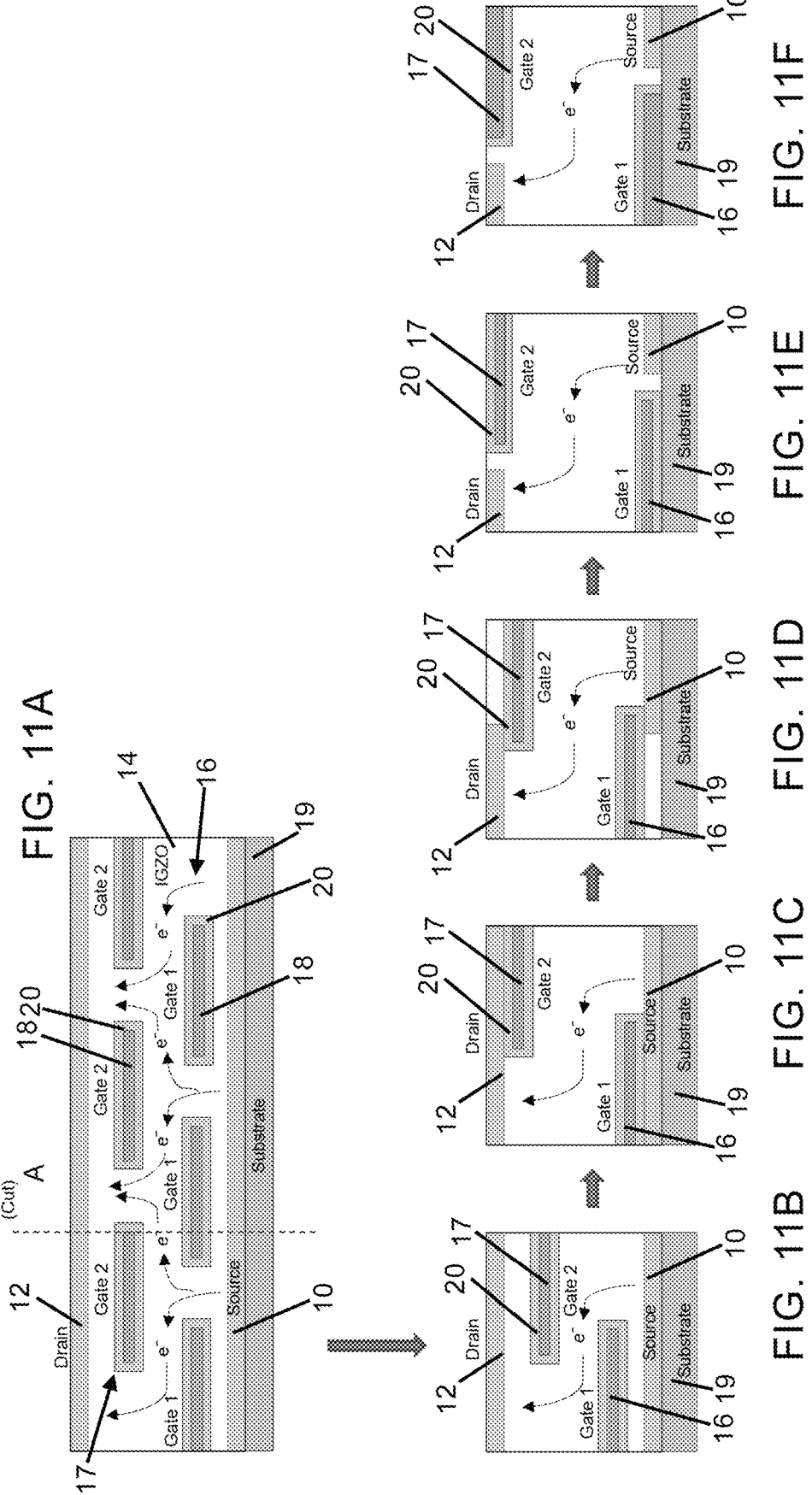
FIG. 11A-11F show further example embodiments of a vertical TFT structures having reduced size as compared to the example embodiments of FIGS. 10A-10C in accordance with the present invention.

FIGS. 11A-11F illustrate reduced size vertical TFTs based on the same simplified structures shown in FIGS. 10A-10C above. FIG. 11A corresponds to FIG. 2A showing a cut line A. Removing ⅔ of the vertical TFT structure of the FIG. 2A embodiment at the cut line A results in a structure of reduced size, which can then be simplified in the same manner as discussed above in connection with FIGS. 10A-10C.

In particular, the FIG. 11B embodiment shows a first gate electrode 16 which may be at least partially offset horizontally from a second gate electrode 17. In such an example embodiment, the first gate electrode 16 and the second gate electrode 17 may be insulated from the semiconductor layer 14 by an insulator 20.

FIG. 11C shows a further example embodiment in which the insulator 20 of the first gate electrode 16 in contact with the source electrode 10 over an entire length of the first gate electrode 16. The insulator 20 of the second gate electrode 17 may be in contact with the drain electrode 12 over an entire length of the second gate electrode 17.

FIG. 11D shows a further example embodiment in which the insulator 20 of the first gate electrode 16 in contact with the source electrode 10 over at least a portion of a length of the first gate electrode 16. The insulator 20 of the second gate electrode 17 may be in contact with the drain electrode 12 over at least a portion of a length of the second gate electrode 17.

FIG. 11E shows a further example embodiment in which the first gate electrode 16 may be positioned on the same horizontal plane as the source electrode 10. In addition, the second gate electrode 17 may be positioned on the same horizontal plane as the drain electrode 12.

FIG. 11F shows a further example embodiment in which a portion on the insulator 20 surrounding the first gate electrode 16 and the second gate electrode 17 is removed, in particular the portion that is no longer required to insulate the gate from the semiconductor or the electrodes is removed or omitted.

In accordance with the present invention, any or all of the gate electrodes, the source electrode and/or the drain electrode may be patterned electrodes. As discussed above, the gate electrodes may comprise a patterned structure consisting of combs or fingers. FIG. 9 shows a gate electrode 16″ having micro-perforations.

Figures 12A, 12B, 12C:
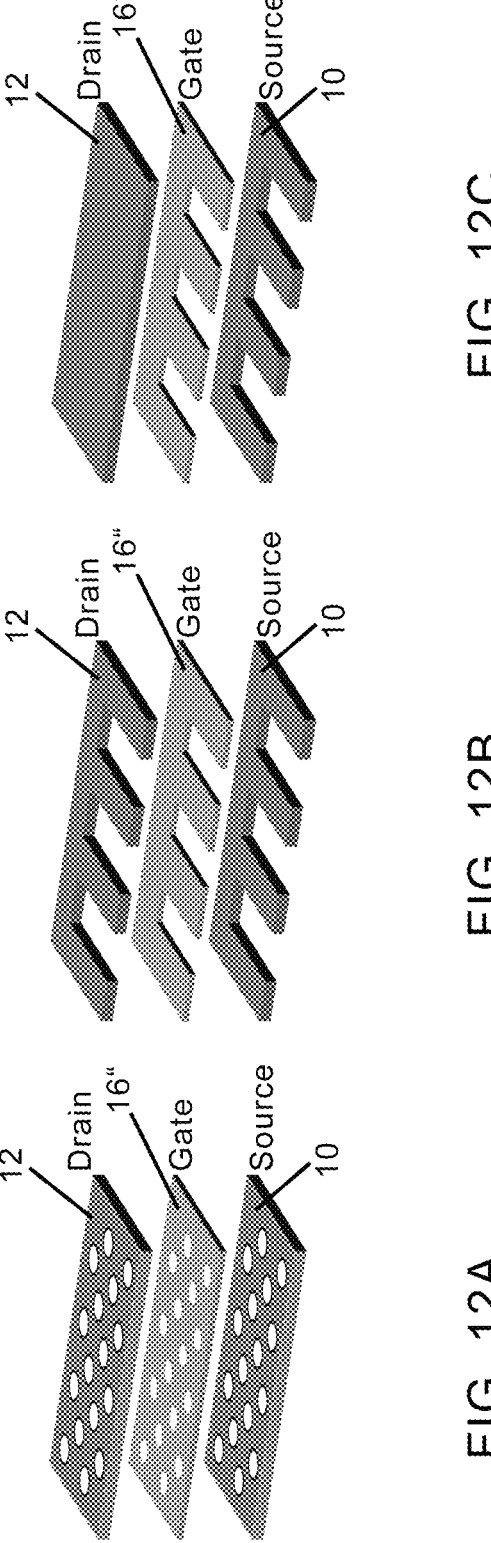
FIGS. 12A-12C show example embodiments of patterned structures for source, drain and gate in accordance with the present invention.

In a further example embodiment, each of the source electrode 10 and the drain electrode 12 may comprise patterned electrodes. Each of the at least one gate electrode 16, 17 may comprise additional patterned electrodes. Each of the patterned electrodes and additional patterned electrodes may comprise substantially identical patterns. Examples of patterned gate, source and drain electrodes are shown in FIGS. 12A-12C. The substantially identical patterns may comprise one of micro perforations as shown in FIG. 12A, a mesh structure, a lattice structure, a comb-like structure as shown in FIGS. 12B and 12C, or the like.

In example embodiments where the at least one gate electrodes 16, 17 are insulated from the semiconductor layer by an insulator 20, the insulator may be formed by oxidation of the gate electrode via one of thermal annealing, joules heating, and an electric field assisted annealing process.

In addition, one or more of the source electrode 10, the drain electrode 12, and the at least one gate electrode 16, 17 may be formed via a back side exposed fabrication technique, as discussed in detail with regard to FIGS. 17A and 19 below.

Figures 13A, 13B:
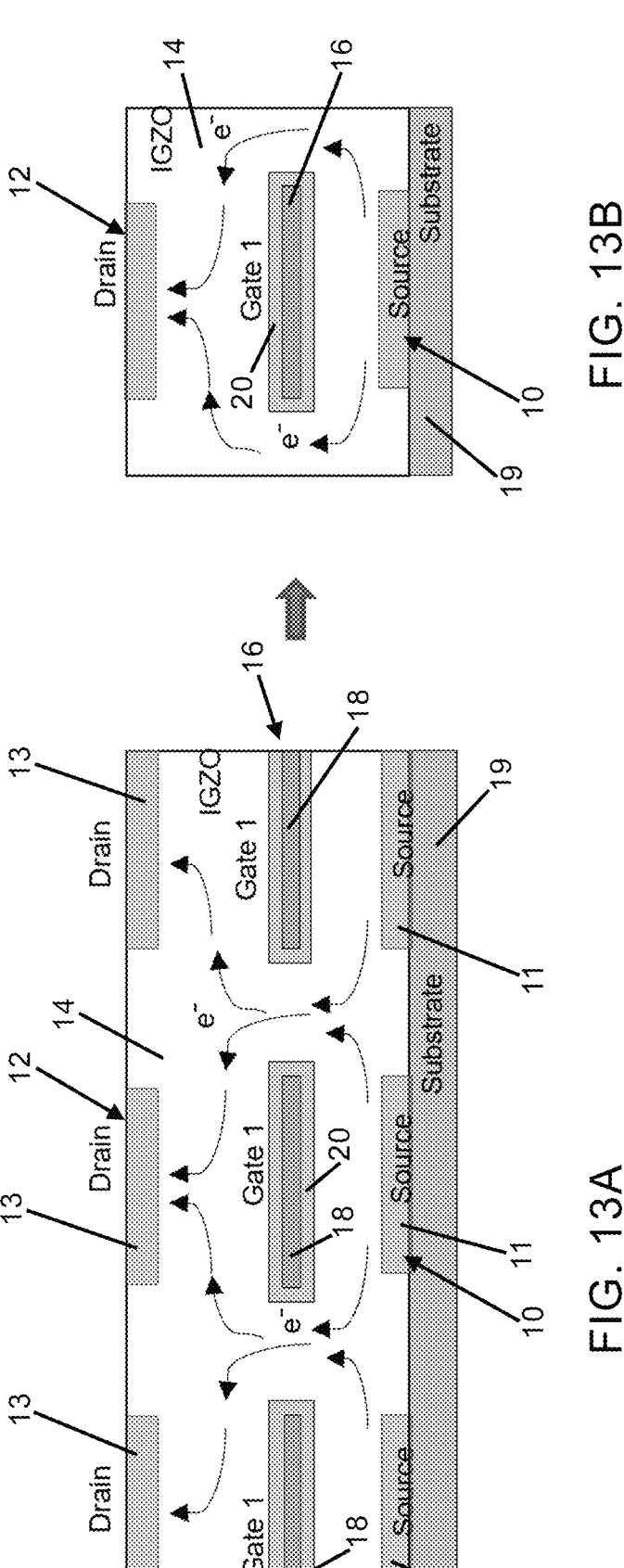
FIGS. 13A and 13B show example embodiments of a VTFT structure having only one gate electrode in accordance with the present invention.

In a further example embodiment of a vertical TFT as shown in FIG. 13A, the vertical TFT may comprise a source electrode 10 and a drain electrode 12, the drain electrode and the source electrode being positioned on vertically separated planes. A semiconductor layer 14 may be arranged in between the source electrode 10 and the drain electrode 12. A single gate electrode 16 may be embedded in the semiconductor layer 14 between the source electrode 10 and the drain electrode 12. The single gate electrode 16 is a patterned electrode which is positioned to allow a flow of electrons to pass between the source electrode 10 and the drain electrode 12.

The source electrode 10 may be a patterned electrode comprising a first comb-like structure comprising one or more electrically connected fingers or combs 11. The drain electrode 12 may be a patterned electrode comprise a second comb-like structure comprising one or more electrically connected fingers or combs 13. The patterned gate electrode

16 may comprise a third comb-like structure comprising one or more electrically connected fingers or combs 18. The one or more fingers 18 of the single gate electrode 16, the one or more fingers 11 of the source electrode, and the one or more fingers 13 of the drain electrode 12 may all be vertically aligned.

The patterned electrodes may all comprise substantially identical patterns. The substantially identical patterns may comprise one of micro perforations, a mesh structure, a lattice structure, a comb-like structure, or the like.

It should be appreciated that each vertical TFT may have one or more of patterned source, drain and gate electrodes and these patterned electrodes may have identical patterns, substantially identical or similar patterns, or different patterns. For example, in the case of fingers, the fingers of the gate electrode may be of a different size (thickness, width, spacing) than the drain or source, or vice versa. For perforated or mesh patterned electrodes, one or more of the electrodes may have perforations or mesh structure with different dimensions than the other.

FIG. 13A shows an example embodiment of a vertical TFT structure having a single gate electrode 16 where the gate electrode 16, the source electrode 10 and the drain electrode 12 have a patterned electrode structure comprising fingers or combs. It should be appreciated that any or all of the gate electrode 16, the source electrode 10 and the drain electrode 12 may be so configured. FIG. 13B shows a further example embodiment of a vertical TFT structure having a single gate electrode 16 wherein all the electrodes of the vertical TFT structure of FIG. 13A have an identical pattern such as micro perforations, a mesh structure, or a lattice structure and are each vertically aligned with one another.

It should now be appreciated that the present invention provides an advantageous TFT structure employing a gate structure which provides a high drain current with fast switching capabilities. A high drain current is achieved since the vertical TFT structure shortens the distance between the source and the drain, shortening the current flow path and resulting in less ohmic loss. In addition, the conduction path between the source and the drain is substantially vertical, thereby achieving a 3-D volume flow.

It should also be noted that the present invention makes it practical to use commonly available fabrication methods in TFT technology that have limited patterning feature size, typically in micrometers. Other fabrication techniques that afford finer feature sizes down to nanometers, or other material innovations for generating perforated gate material may lead to a possibility of reducing the number of gate electrodes to one. The small passageways the electrons have to pass through would control the current flow sufficiently to gain a reasonably good switching behavior with just one layer of gate electrode.

In one example embodiment for fabrication of a Vertical TFT with comb-gate electrodes in accordance with the present invention, one goal is to ensure that the gate electrode(s) are completely insulated (electrically) with an insulator, preferably an oxide or nitride, from the surrounding semiconductor in order for the device to function as a transistor. In such a fabrication method, it is assumed that the semiconductor layer is based on one of silicon or a silicon-based material, a III-V semiconductor material, an organic semiconductor material, a metal oxide type semiconductor material, e.g. IGZO (Indium, Gallium, Zinc, Oxide), that contains oxygen, a metal nitride semiconductor material, e.g. GaN that contains nitrogen, an oxide-based semiconductor material, or a metal oxynitride semiconductor material, e.g. ZnON that contains oxygen and nitrogen. It is also assumed the gate electrode material is a metal, e.g. Aluminum, Titanium, or the like. The source and drain electrode material can also be metal, but may or may not be the same metal as the gate electrode, e.g. Molybdenum, Aluminum, or the like. Conductive oxides, e.g. ITO and IZO may also be used for the source/drain electrodes.

In forming the vertical TFT, the deposition order may be (in a vertical stack from bottom to top):

Substrate (insulator)

Source electrode (metal 1)

Semiconducting layer (e.g. IGZO)

Comb Gate electrode 1 (metal 2), patterned (perforated or comb structure)

Semiconducting layer (e.g. IGZO)

Comb Gate electrode 2 (metal 3), patterned (perforated or comb structure)

Semiconducting layer (e.g. IGZO)

Drain electrode (metal 4)

The three different depositions of the same semiconducting material produces one connected semiconducting layer, as the layer boundaries disappear (other than the gate electrodes). Gate electrodes 1 and 2 are initially preferably in Ohmic contact with the semiconducting layer since they are completely encased by the semiconducting layer. The source and drain electrodes are also in ohmic contact with the semiconducting layer and this ohmic contact is to be maintained.

It should be appreciated that, since the semiconducting layers are applied in three stages, different semiconducting materials (or different application techniques) can be used to form each semiconducting layer.

The critical task in the process is to form the insulating layer around the gate electrodes for the device to function, making a Metal(gate)-oxide-semiconductor (MOS) structure.

In the formation of the insulating oxide around the gate electrode structures, the aim is to maintain the ohmic contact of the source and drain electrodes. Using Molybdenum as the source and drain electrode material is preferable, while ITO and IZO can also be used, as these materials also survive with ohmic contact.

A high temperature thermal annealing will produce oxides around the gate electrode metal by drawing oxygen from the semiconducting material that already contains oxygen. However, the aim is to form the insulating oxide around the gate electrodes, but not at the source and drain electrodes. A first solution is to deposit a different metal for the source and drain contacts (metal 1 and metal 4) that oxidizes at a higher temperature than the gate electrode metal (metal 2 and metal 3). In such an embodiment, the device can be subject to an annealing process at a temperature and duration that forms oxides around the gate electrodes, but not around the source and drain electrodes. For example, aluminum may be used for the gate electrodes and molybdenum may be used for the source and drain electrodes. In general, Aluminum oxidizes at a lower temperature than Molybdenum. Al2O3 (alumina) forms around bare aluminum even at room temperature when exposed to air. At certain annealing temperatures, Aluminum will draw oxygen from the IGZO semiconducting layer to form an Al2O3 insulator, while Molybdenum will stay un-oxidized and maintain the ohmic contact with IGZO.

Even if Molybdenum source or drain electrodes is partially oxidized, the non-stochiometric MoOx that forms is still highly conductive and does not impair device operations. The temperature, the duration of annealing and annealing atmosphere will affect the thickness of the oxide around the gate electrodes.

A second solution is to use local Joules heating. In such an embodiment, the same or different metal may be deposited for the source and drain electrode material (metal 1 and metal 4) and for the gate electrode material (metal 2 and metal 3). The device may be subject to an annealing process at a temperature just below the temperature at which the source and drain electrodes oxidize. Current is then applied between the two gate electrodes to produce Joules heating on the surface of the gate electrodes. The current can be AC or DC, or a combination (e.g. AC with a DC offset). The gate electrodes will oxidize due to locally elevated temperatures. The current will be reduced or stop flowing once the oxidation is complete and gate electrodes are insulated.

The current can also be applied between the gate electrode(s) and either the source or drain electrodes, or both. The larger surface area on the source and drain electrodes would reduce Joules heating there. As a result, the gate electrode(s) heat up more than the source and drain electrodes, and thus will oxidize before the source and drain electrodes.

It might be advantageous if only one of the two gate electrodes is selected at a time for joules heating since the larger combined surface area of the source and the drain electrodes will reduces corresponding joules heating at the source and the drain electrodes, localizing heating to that one gate electrode so that it oxidizes before the source and drain electrodes.

The progress and completion of the oxide formation can be monitored by resistance or capacitance measurements, or by an amount of time measurement of the current flow.

Figure 14A:
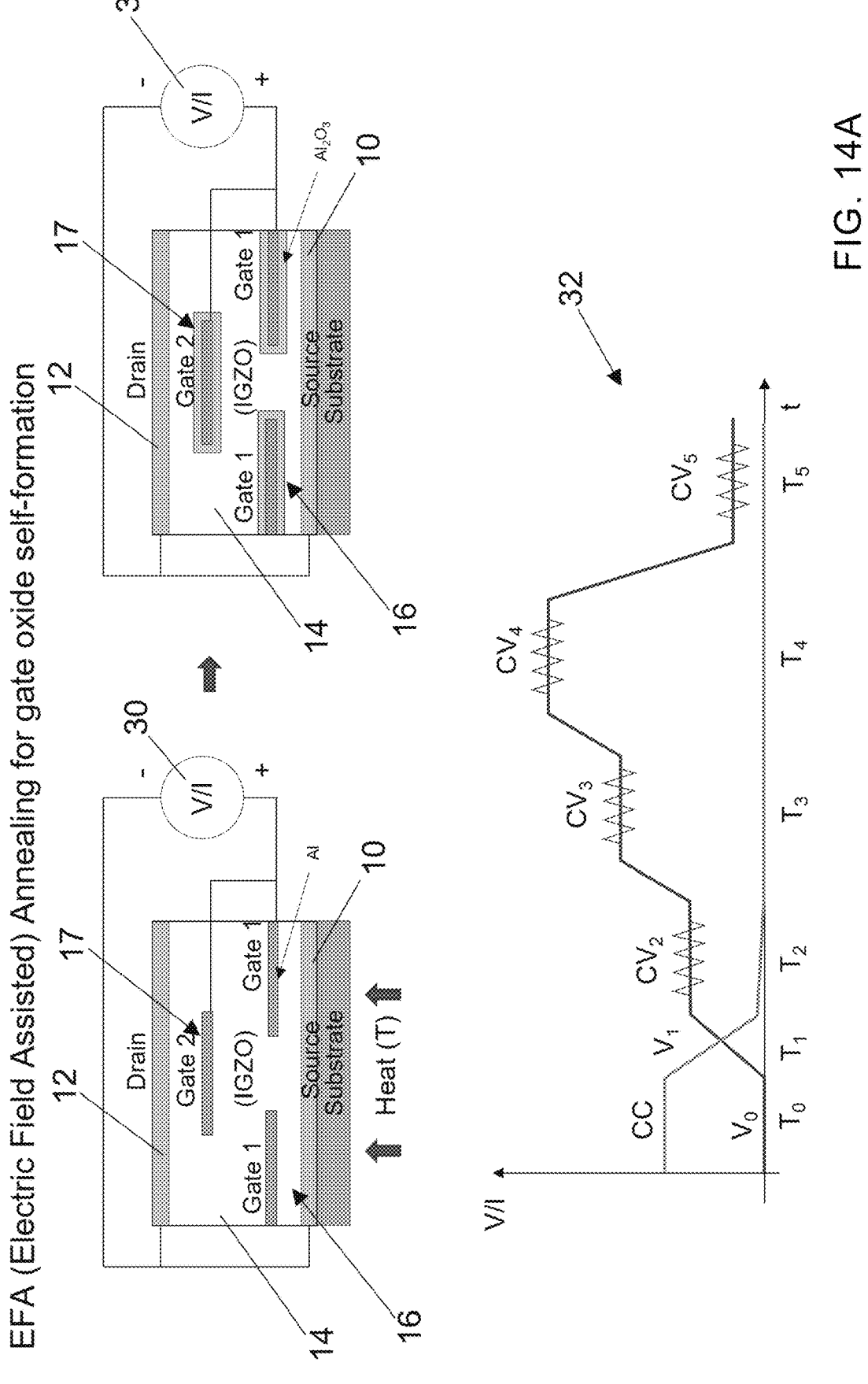
FIG. 14A shows an example process for Electric Field Assisted Annealing for gate oxide formation in accordance with an example embodiment of the present invention.

A third solution is use voltage to assist in oxide formation in addition to the techniques of solution two above (also referred to herein as electric field assisted annealing (EFA annealing)), in order to obtain a thicker oxidation layer around the gate electrodes. An example of such an EFA annealing process is shown in FIG. 14A, including a plot 32 of the voltage and current applied over time during the EFA annealing process. Like solution two above, the same or different metals may be used for the source and drain electrodes 10, 12 as well as for the gate electrodes 16, 17. The device may be subject to an annealing process at a temperature just below the temperature at which the source and drain electrodes oxidize, such that oxygen from the IGZO semiconductor layer 14 will migrate to the aluminum gate electrode structure to form an aluminum oxide layer around the gate electrodes 16, 17. Constant Current CC is then applied between the two gate electrodes 16, 17 via a voltage and current source V/I 30 which is set to a maximum of $CV_2$. This initially produces some Joules heating on the surface of the gate electrodes and promotes migration of oxygen toward gate electrodes 16, 17. For example, the current level CC may be applied between time $T_0$ and $T_1$. When the current stops flowing, it indicates a formation of at least a thin layer of oxide around the gate electrodes 16, 17. The maximum value of the current will be less than the CC value and then will eventually become zero as the oxide forms. At this stage, a higher voltage may be applied to the gate electrodes. For example, at time $T_1$ the current CC may start to drop and fall off to zero at time $T_2$, while at the same time the voltage may rise from $V_0$ to $V_1$, reaching a constant voltage of $CV_2$ at time $T_2$. The resultant high electric field will promote more migration of the oxygen out of the metal oxide semiconductor 14 (e.g., IGZO) and allow thicker formation of the oxide around the gate electrodes 16, 17. The applied voltage can be AC or DC, or a combination (e.g., AC with a DC offset). The voltage may be increased as the oxide gets thicker, but below the breakdown voltage of the oxide already formed. For example, the voltage may increase to $CV_3$ at time $T_3$ and then to $CV_4$ at time $T_4$. Optionally an AC current can be added together with the increased voltages. At this stage, a capacitance measurement can be used to obtain an indication of the thickness of the oxide formed and can be used to stop the applied voltage and the annealing process. The optimum duration, the temperature profile over time, and the voltage profile over time can be determined experimentally. Certain parameters can be modified or modulated based on the on-going measurements, including the capacitance.

When it is not desirable or it is difficult to produce a self-formed gate oxide, the fabrication method can adopt a multi-layer approach, where a gate oxide, gate metal, and gate oxide layers are deposited sequentially. This tri-layer stack can be formed by a single mask using various deposition methods.

This electric field assisted (EFA) annealing method can potentially improve the quality of the gate oxide, whether the oxide is either deposited or self-formed. The electrical energy, in addition to the thermal energy, promotes interaction and rearrangement of the atoms involved, which would produce a more stable and uniform oxide with less defects. For example, EFA can promote more Al2O3 formation and less of Al2O2 or Al2O1 which are less desirable. EFA can also improve the quality of the IGZO layer in a similar way.

It should be appreciated that in the second and third solutions discussed above, the polarity of the DC current or voltage will impact the process. A positive voltage on the gate electrode will help attract the oxygen atoms (which are typically negatively charged) to the gate electrode to oxidize the gate electrode. Conversely a negative voltage on the source or drain electrode will prevent or slow down oxidation and therefore help maintain the ohmic contact of the source or drain electrode with the semiconductor layer.

Figure 14B:
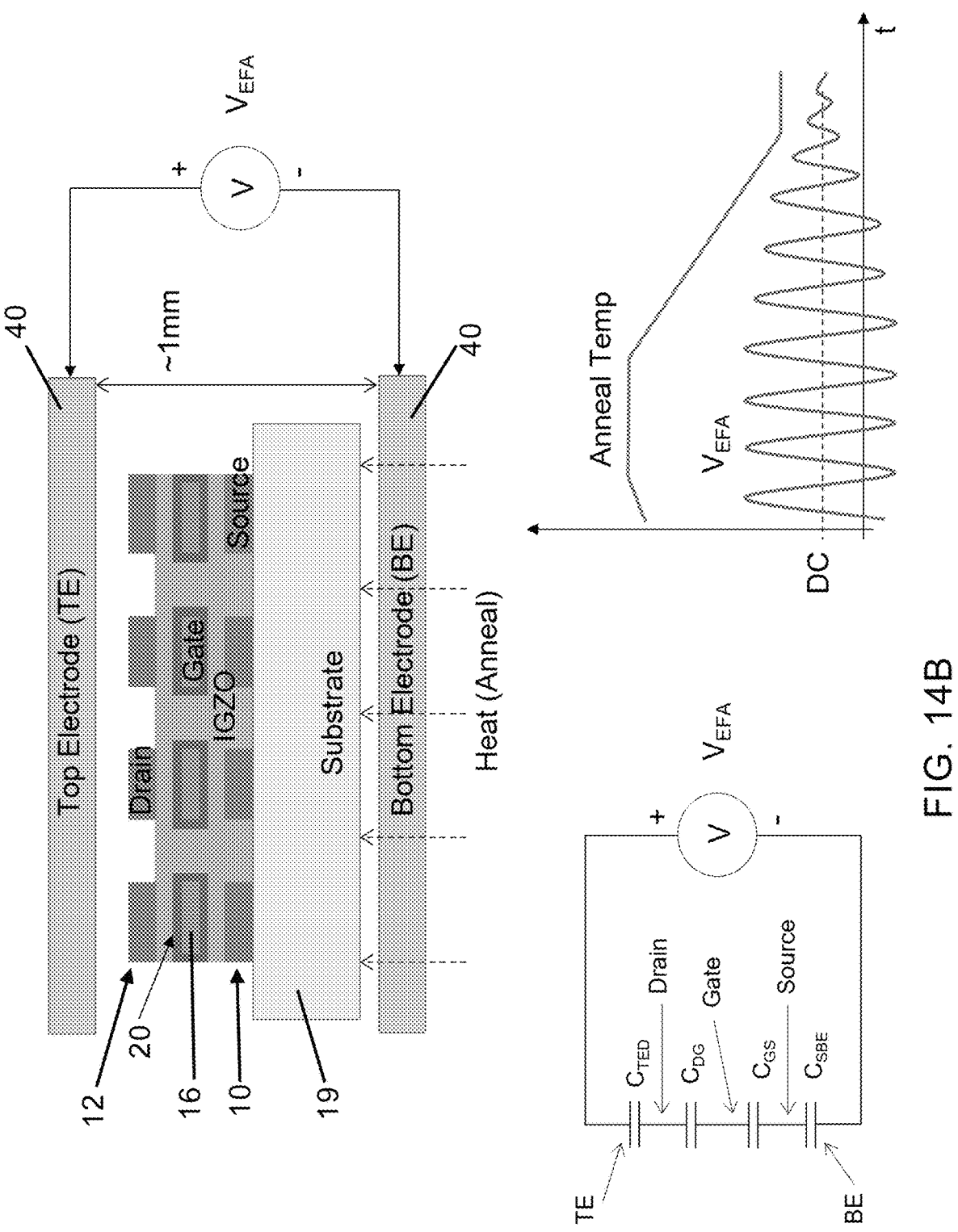
FIG. 14B shows an example process for Non-Contact Electric Field Assisted Annealing for gate oxide formation in accordance with an example embodiment of the present invention.

A further example embodiment of oxide formation using electric field assisted (EFA) techniques in accordance with the present invention is shown in FIG. 14B and involves non-electrical contact EFA annealing. FIG. 14B shows a vertical TFT with patterned source, drain and gate electrodes as an example, and it should be appreciated that this oxidation technique can be used for other vertical TFT structures.

In non-contact EFA annealing, two high voltage electrodes 40 are placed at the top and bottom of the processed wafer but are not in electrical contact with the wafer. Voltage supplied by voltage source $V_{EFA}$ to the two electrodes 40 may be DC only, or AC voltage with a DC offset. The applied DC voltage can vary over time, and the AC amplitude/frequency can also vary over time. The outer layer of the gate electrode is oxidized by drawing oxygen from the IGZO semiconductor layer 14 (which in turn draws oxygen from the air during the annealing process). The electric field created between the two electrodes 40, together with an elevated annealing temperature, promotes oxidation of the gate electrodes to form the gate oxide insulator 14. The gate electrode 16 is capacitively coupled to $V_{EFA}$ via $C_{TED}$ (capacitance between the top electrode 40 and the drain), $C_{DG}$ (capacitance between the drain electrode 12 and the gate electrode 16), $C_{GS}$ (capacitance between the gate electrode 16 and the source electrode 10), and $C_{SBE}$ (capacitance between the source electrode 10 and the bottom electrode 40) as shown in FIG. 14B.

The metal of the gate electrode 16 is different from that of the source electrode 10 and the drain electrode 12 such that the gate electrode oxidizes more easily than the source electrode 10 and the drain electrode 12. The heat for annealing may be applied from the bottom of the substrate 19.

Several Vertical Thin Film Transistor (VTFT) structures have been described herein. In addition, a comparison has been shown against a conventional Lateral Thin Film Transistor (LTFT), where the current flow occurs laterally or horizontal to the substrate. VTFT changes this advantageously, by allowing the current to flow vertically, perpendicular to the substrate, thereby achieving much higher current flow. In both cases, the preferred semiconductor material is IGZO (Indium Gallium Zinc Oxide), which is an amorphous semiconducting oxide often used for flat panel displays.

FIG. 15A (Type I having staggered gate electrodes), 15B (Type II having a micro perforated gate), and 15C (Type III having a comb-gate structure) show example embodiments of VTFT structures discussed in detail herein. FIG. 15D (LTFT) shows a conventional lateral TFT (a bottom gate version) for comparison purposes.

For all VTFTs, the source and the drain electrodes are parallel to each other but on a different horizontal plane. The source and the drain electrodes are on the opposite side of the semiconductor layer, an IGZO layer in this example (IGZO is an N-type semiconductor where the current carriers are electrons, negatively charged). The gate electrode or electrodes are also in parallel and placed in between the source and the drain electrodes. LTFTs, on the other hand, have the source and the drain electrodes on the same plane and on the same side of the semiconductor layer. Since the current flows between the source and the drain electrodes, only a lateral, or horizontal, conduction of the carriers is possible with LTFTs, whereas a vertical conduction of the carriers is accomplished with VTFTs. This 3-dimensional volume flow significantly improves the current handling capability of the VTFT as compared to an LTFT.

In both VTFT and LTFT designs, a good electrode to electrode alignment or registration is very important for the function and the performance of the TFT. For example, controlling the gate to gate overlap in VTFT Type I and VTFT Type III is very important. On the other hand, VTFT Type II requires micro perforations on the gate electrode where the size of the holes may have to be in the order of 10's of nanometers for good performance. Typically, this is not feasible on a large area thin film process the industry uses where the minimum feature size is 1 micrometer or larger. LTFT on the other hand can benefit if the gate to source/drain electrode overlaps are minimized, in order to reduce the gate capacitance that could slow down the speed of the transistor switching.

The present invention introduces a method of fabricating IGZO VTFT using back side exposure of the photoresist (PR), along with a variation of VTFT Type II structure that becomes easier due to this new fabrication method. Please note that VTFT Type II requires only one gate electrode as opposed to 2 as required for Type I and Type III, but the precise micro perforation required is not easy to accomplish in large area TFT manufacturing. Back Side Exposed (BSE) technique allows self-aligning of the critical layers, especially the gate electrode, where the precise registration between the layers can be better controlled than is possible by aligning multiple masks. This also reduces the number of masks needed to fabricate the TFT, saving time and cost. A precise alignment of the critical layers can also lead to other benefits, such as lower parasitic capacitance between the layers, faster device operation, higher current, better device to device uniformity, etc.

Back Size Exposed (BSE) fabrication technique starts with a deposition and patterning of at least one material layer using a conventional photolithography technique. One layer is assumed for this example and is referred to as the first layer. This typically involves blanket coating the desired material onto the substrate, coating a photoresist (PR) that is ultraviolet light (UV) sensitive, exposing the PR using a photomask that has the desired pattern, then developing the PR, followed by etching of the material unprotected by the developed PR. The PR is then removed revealing the patterned layer, and the process usually repeats for the next layer.

For BSE to work, the already patterned first layer must be opaque to UV and the substrate must be transparent to UV. A typical substrate for a large area TFT processing is UV transparent, such as glass, quartz, or polymer-based film. A typical electrode is metal, such as Molybdenum (Mo), Aluminum (Al), Titanium (Ti), Copper (Cu), etc. which blocks UV. The patterning of the first layer can be done using a positive PR or a negative PR, as described early. Either etching or a liftoff process can be used, as long as the first layer is patterned on the substrate. Alternatively, patterning the first layer can also be accomplished using Nano Spheres, which have been colloidal processed to form a single monolayer, as described in detail below.

The first B SE step starts with a coating of negative type PR on top of the already patterned layer, in this example the first layer. Rather than exposing the PR from the top side (process side), BSE exposes the PR from the back side, through the substrate, through the patterned first layer, then onto the PR. There is no photomask involved. Instead the first layer acts as a hard mask. The metal on the first layer would block UV, and the open area in the first layer would pass UV and expose the PR. Once the PR is developed, the exposed part of the PR stays (negative PR type), and the remainder gets removed. The remaining PR pattern is opposite to the first layer pattern, and is therefore a negative image.

Next, the second desired layer material is deposited as before. Some of this second layer will land on where the PR is missing and some will land on top of the patterned PR. This is followed by removing or dissolving the PR, which also removes the material on top of the PR. This is called a liftoff process. The remaining material will have a negative image of the removed PR, but will be positive image of the first layer. The end result is a second layer pattern that is identical to the first layer pattern.

Now, the same thing could have been accomplished by depositing layer one and layer two together in the first place, and patterning them together using the first photomask from the process side. However, the usefulness of BSE is when there has to be another layer in between the first patterned layer and the second patterned layer. This in-between layer may have to be patterned differently or at a later time, which makes it impossible to transfer the pattern from the first layer to the second layer. BSE allows this to happen, as long as the in-between layer is also UV transparent.

BSE can also make the negative image of the first layer to be transferred to the second layer, if the PR used is a positive type instead of a negative type. Again, a liftoff process is used, since PR is deposited before the second layer material is deposited.

Figure 16A:
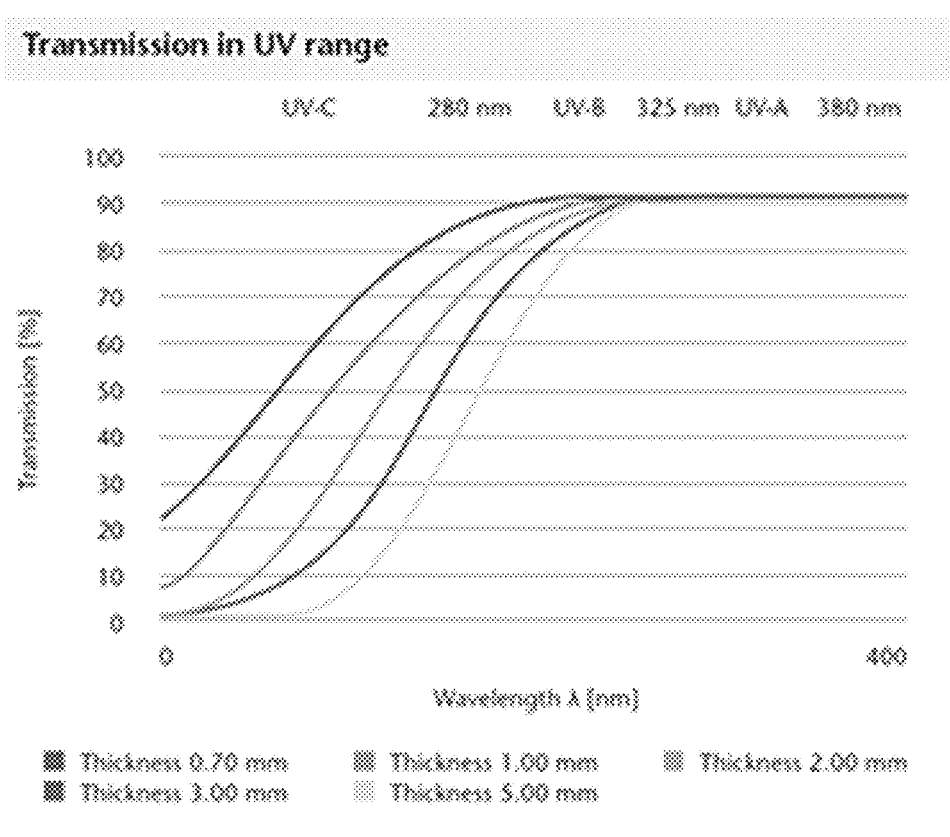
FIG. 16A shows a prior art UV Transmission characteristic of a typical borosilica glass substrate.
Figure 16B:
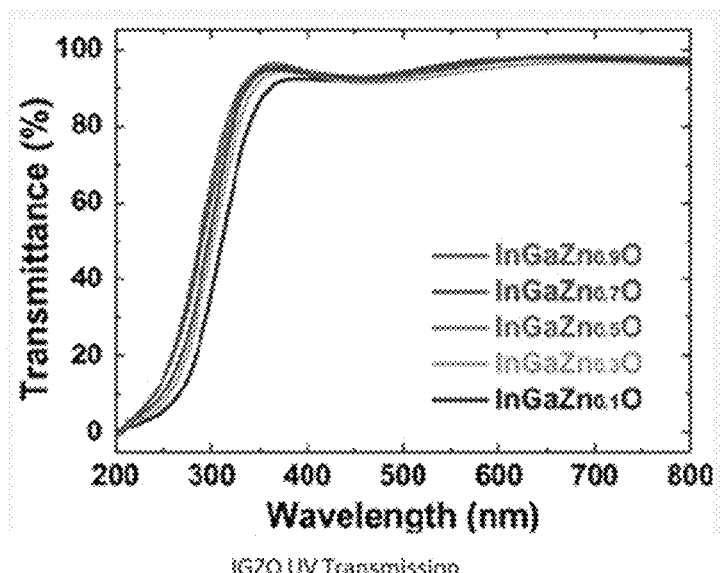
FIG. 16B shows a prior art UV Transmission characteristic of a typical amorphous IGZO semiconductor.

For the purposes of the IGZO TFT fabrication, this in-between layer is IGZO, which is known to be transparent to UV. FIGS. 16A and 16B show the optical properties of the borosilica glass and the IGZO, respectively. UV used for a typical PR exposure is between 350 nm to 450 nm in wavelength, and will therefore pass through the substrate glass and the IGZO layer. The UV is only blocked by the pattern on the first layer, transferring its pattern to the PR.

FIGS. 17A and 17B show an example of B SE processing that involves patterning the source electrode (Mo) and the gate electrode (Al) with an IGZO layer in between (IGZO to be patterned in a later step).

FIG. 17A shows a conventional photolithographic patterning process prior to the start of the BSE process of FIG. 17B. The UV exposure of PR1 from the top side through Mask1 leaves the PR1 pattern that protects the Source layer, and the Source electrode is formed according to the pattern on Mask1. This is followed by the back side exposure of PR2, forming the Gate electrode according to the pattern of the Source electrode as shown in FIG. 17B. The IGZO layer in between is patterned later. The result is two identical patterns of two of the layers, perfectly aligned together (self-aligned) with another layer in between.

It should be noted that different chemicals and processing techniques are chosen to etch different material layer selectively. The selectivity is usually very good, especially between PR, metal, and oxide. The selectivity with a semiconductor such as IGZO may not be always good and a good processing engineering needs to take this into account to have the desired result.

As can be seen, using a combination of a top side exposure with a photomask and a back side exposure with the already deposited layer as a hard mask, a complex patterning can be accomplished. As explained, all combinations of positive and negative photoresist can be used along with an etching and liftoff processes, extending the patterning possibilities. However, once enough patterns are formed that together do not allow UV to pass through, no more BSE patterning is possible.

FIG. 17C shows such an example. After Source and Gate1 are formed using the process in FIGS. 17A and 17B, Gate2 is formed using BSE. A positive PR is used instead, which results in a pattern complimentary to Source and Gate1. No more BSE patterning becomes possible. However, 3 different layers are patterned using only one photomask. The resulting Source, Gate1, and Gate2 layers are now self-aligned and provides a configuration that is useful for a few variations of VTFT.

Desirable VTFT structures can be built using the BSE method. Further, an alternative method of fabricating VTFT Type II can be achieved with B SE.

Referring to Applicant's FIG. 9 embodiment (which shows a perspective view of the VTFT Type II) having a gate electrode 16" with micro perforations, even though a full vertical flow of carriers is possible through the tiny holes 22 in the single gate 16" between the Source 10 and Drain 12, the micro perforated gate 16" is difficult to fabricate using conventional techniques. If the holes 22 are too large, the gate electrode may not be able to control the current flow from the source electrode 10 to the drain electrode 12, and therefore the transistor will be leaky when turned off. Layer 14 is the semiconductor layer, IGZO in the example, deposited both top and bottom of the gate.

FIG. 18A shows a side view of the micro perforated gate VTFT Type II which can be manufactured using a backside exposed fabrication technique. Additional vertical TFT structures, such as VTFT Type II-b-mf (backside-multi-finger shown in FIG. 18B) and VTFT Type II-b-sf (backside-single-finger shown in FIG. 18C) can also be fabricated using BSE. The single-finger version of FIG. 18C is simply a subset of the multi-finger version of FIG. 18B and is simpler to fabricate.

Patterning the Source, Drain, or Gate electrodes can also be accomplished using Nano Spheres. It is well known that a colloidal process can be used to self-assemble a monolayer of Nano Spheres (NS), such as Polystyrene Nanospheres (PN). Polystyrene Nanospheres typically come in diameters between 10 to 1000 nm. This can be coated on a substrate to form a densely packed monolayer that can be used for micro patterning tiny holes. The resulting holes can be a fraction of the original diameter of the Nano Spheres (NS) which can be the basis for the micro perforated electrodes for VTFT. Basically, the Nano Spheres act like a photoresist that can be lifted off to leave tiny holes, regularly spaced.

The important aspect of these two designs is that the source and the drain electrodes are patterned, instead of being a solid one piece as in other TFT designs. In previous VTFT structures, only the gate electrode was patterned, in a comb configuration with multiple comb fingers. This patterning of the source and the drain electrodes mimics the patterning of the comb gate electrode, such that the direct electric field from the source to the drain is blocked and shielded by the shape of the gate electrode. This allows the gate electrode voltage to control the flow of the carriers (electrons) efficiently, turning the transistor on and off. This way a single gate electrode can control the flow of carriers without requiring micro perforations. The finger to finger gap in the gate electrode is in the order of 1 to 2 um, a few orders of magnitude larger than the micro perforation required.

When the gate to source voltage is zero or negative, the electric field out of the source electrode is zero or negative (dotted lines in FIGS. 18A-18C), therefore the electrons cannot flow out of the source electrode and the transistor is turned off. When the gate to source voltage is positive (as shown in FIGS. 18D-18F), the electric field between the source and the gate is positive (solid lines in FIG. 18D-18F), hence the electrons can flow out of the source electrode. If the drain voltage is also positive, electrons can flow past the gate electrode and flow to the drain, thereby turning the transistor on.

It should be appreciated that the precise alignment between the source, the gate, and the drain electrodes are required for this device to work well. Typical misalignment error that exists between the layers of a conventional large area photolithography process will have difficulty meeting the tolerance required, unless the fabrication process is significantly improved. A self-alignment is desirable to keep the tolerance between these three critical electrodes. The semiconductor layer (IGZO) in between the three electrodes must be patterned differently, in order to allow the carriers (electrons) to flow from the source to the drain, generally going around the gate electrode. However, a precise alignment of the IGZO layer pattern to other electrodes is not critical. As long as the IGZO layer is electrically isolated from adjacent circuits, it need not be patterned accurately.

In addition, it is desirable for the gate electrode to be slightly wider than the source or the drain electrode, in the order of the IGZO thickness involved, around 10 to 100 nm. This provides a better shielding of the source electrode by the gate electrode and keeps the leakage current small when the transistor is turned off. A good process engineering and careful fabrication can control the width of each electrode, usually by manipulating the UV exposure or treatment of the photoresist.

Figure 19:
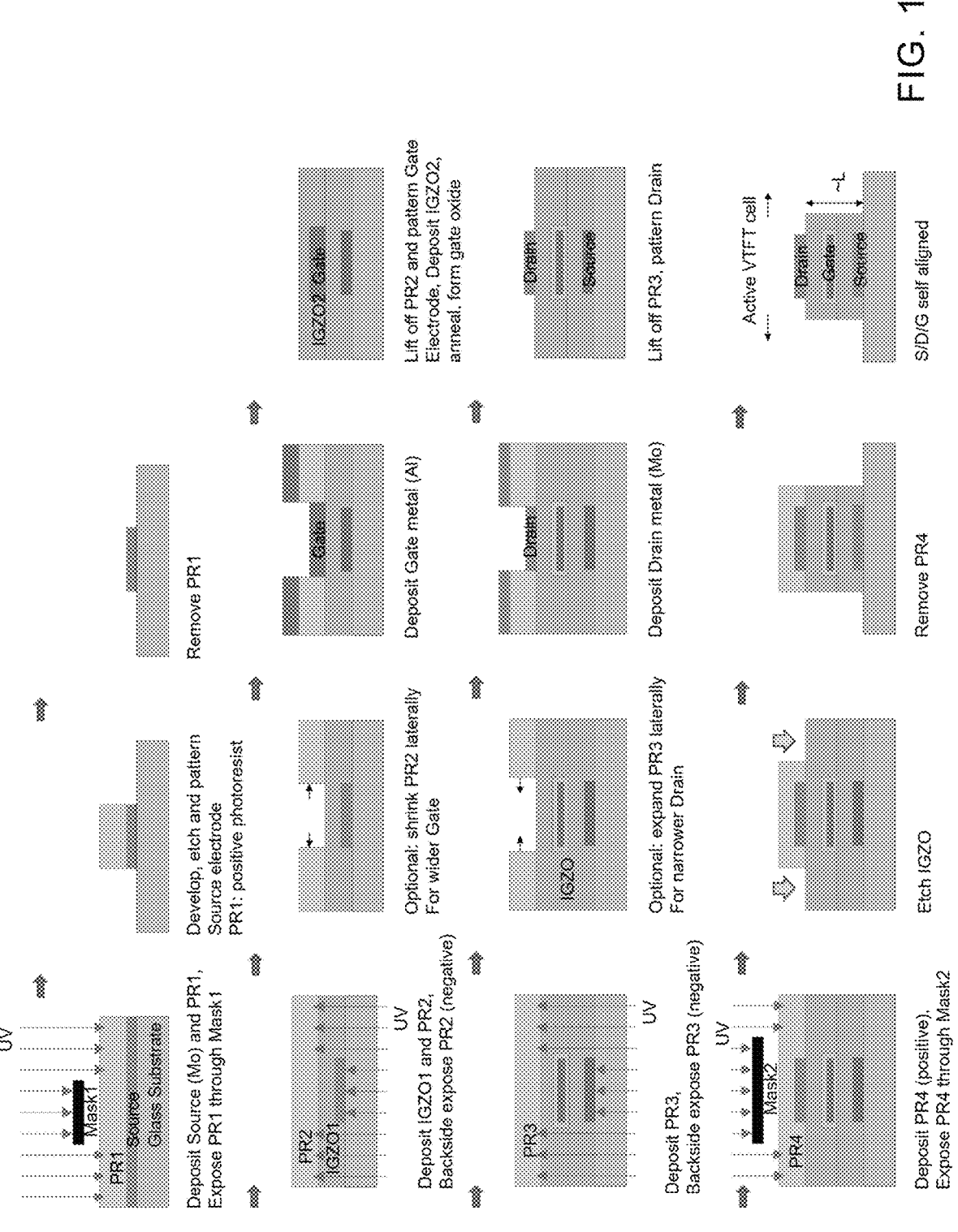
FIG. 19 shows an example process using BSE in accordance with the present invention to produce a VTFT Type II-b-sf.

FIG. 19 shows the complete process flow of the VTFT Type II-b-sf described above using the BSE method. It should be appreciated that, even though the material deposition and patterning all happens on the process side of the substrate (from the top), the back side exposure from the bottom side of the substrate allows a precise registration of the critical layers. At the same time, the number of photomasks required will be smaller than the conventional TFT fabrication method since some of the patterned layers are used as hard masks to pattern subsequent layers, instead of using additional photomasks.

The process flow in FIG. 19 is based on a conventional TFT process using a 2 um design rule and 10 to 100 nm layer thicknesses, except the addition of BSE technique and a self-forming gate oxide technique. Self-forming gate oxide method has been disclosed in above in connection with FIG. 14, along with an EFA (Electric Field Assisted) annealing technique. The gate metal, in this example an aluminum, can oxidize when exposed to oxygen and elevated temperature. This annealing and self-formation of AlOx gate oxide can happen in air, or within IGZO by borrowing oxygen from IGZO (Indium-Gallium-Zinc-Oxide). The missing oxygen can be replenished when IGZO is annealed in air environment at the same time.

In FIG. 19, the first 3 steps show a conventional photolithography for depositing and patterning the source electrode. The source electrode material is deposited on the substrate, followed by deposition of the first photoresist layer PR1. First photomask Mask1 is used to expose UV from the top side, selectively exposing PR1. PR1 is a positive type photoresist, so the exposed part of the PR1 is removed when PR1 is developed. The remaining PR1 protects the source layer underneath from the etchant chemical. The source electrode material unprotected by PR1 is etched away, and the patterning of the source electrode is complete once the remaining PR1 is dissolved away.

The next step deposits the first IGZO layer IGZO1, followed by the second photoresist PR2. This time, UV is exposed from the back side, through the substrate, through the source electrode pattern, through the first IGZO layer, and finally exposing PR2. In this case, PR2 is a negative type photoresist, so the exposed part of PR2 remains on top of IGZO1 when PR2 is developed. This leaves PR2 open above the source electrode, and covered elsewhere on IGZO1. When the gate material is deposited, this open area is filled such that the gate material is deposited on top of IGZO1. The gate material also gets deposited on top of the remaining PR2. However, when PR2 is dissolved, it removes the gate material on top along with it, in a lift-off process. This completes the patterning of the gate electrode which self-aligns perfectly on top of the source electrode with an un-patterned IGZO layer in between.

In this example, the gate electrode is Aluminum (Al) which easily oxidizes in the presence of oxygen. This intermediate structure is annealed at an elevated temperature, that oxidizes the outer layer of the gate and forms the gate oxide that insulates it from IGZO. If this self-formation of gate oxide is not desired, a conventional gate oxide can be deposited below and above the gate electrode prior to patterning by PR2.

After the lift-off of PR2, the second IGZO layer IGZO2 is deposited on top of the patterned gate electrode, with annealed or deposited gate oxide. This is followed by the third photoresist PR3 which is also a negative type. The second back side exposure of UV goes thru the substrate, the source electrode pattern, the first IGZO layer, the gate electrode pattern, the second IGZO layer, then finally exposing PR3. The resulting pattern on PR3 is used to pattern the drain electrode following the similar set of steps above. Again, the resulting drain electrode pattern is self-aligned to the source and the gate electrodes.

Once all 3 electrodes are formed in a self-aligned fashion, the IGZO layer (IGZO1 and IGZO2) must be patterned to isolate it from adjacent transistors. As long as IGZO layer connects the source and the drain electrode and also surrounds the gate electrode such that the current can flow between the source and the drain electrodes, the precise patterning of the IGZO layer is not critical. In the last 4 remaining steps, a conventional photolithographic patterning of the IGZO layer is performed, using the second photomask Mask2 and the fourth photoresist PR4 (positive type). This completes the critical part of the VTFT Type II-b-sf structure.

There may be additional processing steps to form vias to electrically contact the source, the gate, and the drain electrodes and to provide electrical routing. Further processing steps may be necessary to passivate and protect the completed VTFT from the environment, especially the IGZO layer.

Those skilled in the art will appreciate from FIG. 19 how the resulting VTFT Type II-b-sf structure can be concatenated to build VTFT Type II-b-mf device as shown in FIG. 18B. As mentioned, a good process engineering will be able to independently control the width of fingers of the gate electrode relative to the source and the drain electrodes which would result in a low leakage current.

It should be appreciated that many material choices are possible for different layers required for VTFT fabrication. It should also be apparent that more than one layer can be deposited and patterned together with each BSE step.

For example, the gate electrode can be other than Al. Other metal that can easily be processed and oxidized can be used. A non-metal, such as highly conductive doped silicon can be also used. In the case of doped silicon, the oxidation produces silicon dioxide (SiO2) which is an excellent gate insulator. However, instead of self-forming oxide, a desired oxide layer can be deposited along with the gate material and patterned together. For example, SiO2/Al/SiO2 trilayer sandwich has been suggested above.

Another example would be the source and the drain electrodes. In addition to Mo, Ti, Cu, Al, etc. have been successfully used as source and drain electrodes. Most metal electrode will block UV for the purpose of BSE. However, it may be desirable to have the source or drain electrode to transmit UV instead, in order to meet different BSE fabrication needs. Transparent electrodes such as ITO can be used as the source, drain, or signal routing electrode in such situations.

The deposited gate insulator can be other than SiO2, as long as it transmits UV when such UV exposure is desired. The passivation and protection layer can also be other than SiO2 as well, such as SiNx, or a combination of two or more material.

Even though IGZO is used as the semiconducting layer in the examples set forth herein, the BSE method can still apply to other transparent semiconductors and organic semiconductors that transmit UV.

Even though this disclosure has emphasized the use of UV because of the properties of the conventional photoresist and many of the layer material, it should be obvious to those skilled in the art that other optical wavelengths can be the bases for the BSE methods disclosed herein. Deep UV, visible, or IR wavelengths can be used as long as the photoresist is sensitive to those wavelengths and the layer material choices have the desired blocking or transmitting characteristics.

The VTFT Type II-b structure which benefits from BSE method need not be confined to using the comb electrode structure, as long as the pattern allows partial transmission of UV. A mesh pattern, for example, can be used for the source electrode, which will transfer to the gate and the drain electrodes.

The role of the source and the drain electrodes can be switched if desired, in which case the drain electrode would be at the bottom and be patterned first using a comb or mesh structure. In fact, if a P-type semiconductor is used instead of the N-type example in the figures, the bottom electrode would naturally become the drain electrode and the top electrode would become the source electrode.

As explained using FIG. 17C, other VTFT types can be built using BSE that benefit from self-alignment. For example, VTFT Type III requires two gates that separate 3 layers of IGZO sandwiched between source and drain electrodes. By patterning the source electrode into a comb or mesh like structure, a Type III VTFT can be built while keeping the mask count small.

Various types of VTFT can be built using other semiconductors. VTFT Type II-b, for example, can be fabricated using amorphous silicon (a-Si), organic semiconductors, or other metal oxide semiconductors.

Figure 20:
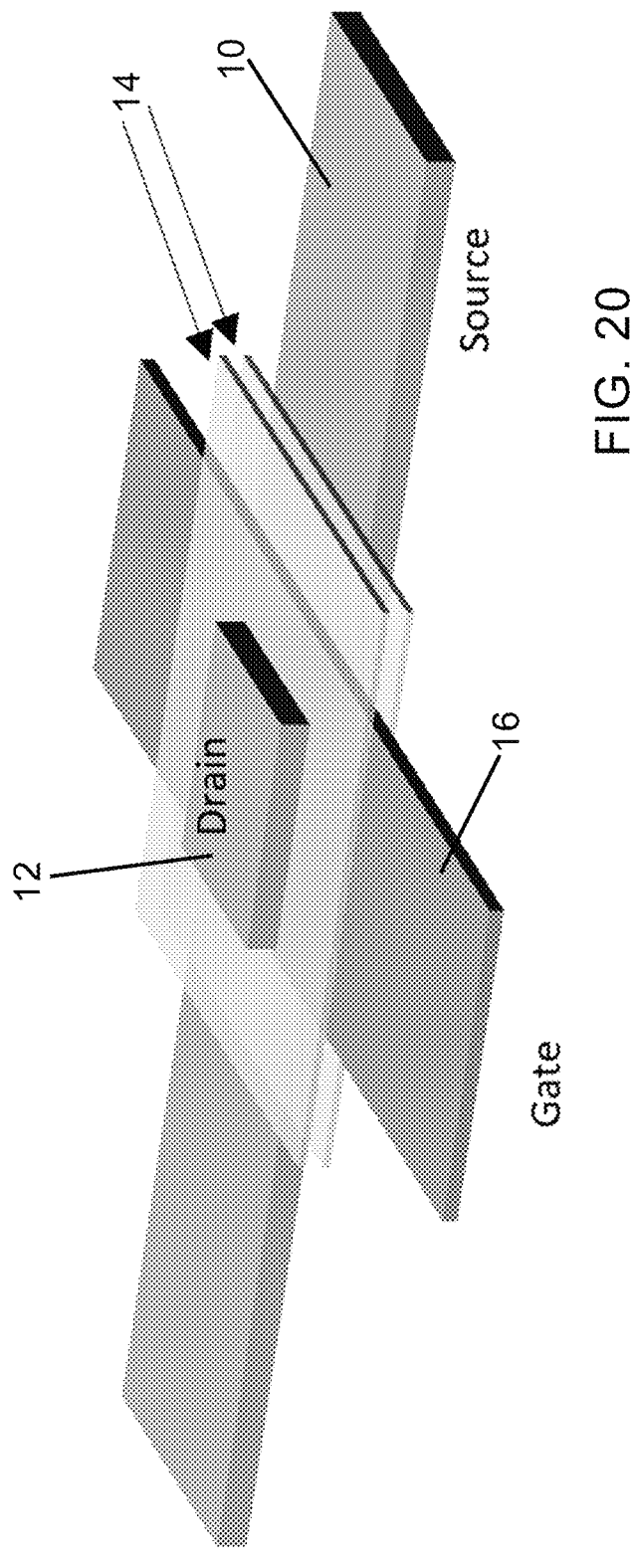
FIG. 20 shows a further example embodiment of a vertical TFT in accordance with the present invention.

FIG. 20 shows a further example embodiment of a vertical TFT in accordance with the present invention. In the FIG. 20 embodiment, the source electrode 10 and the gate electrode 12 form a cross. The drain electrode 12 may be a patterned electrode as discussed above, such that a direct electric field between the source electrode 10 and the drain electrode 12 is blocked by the gate electrode 16. The single gate electrode 16 is arranged in a semiconductor layer 14. When the gate voltage is increased, the accumulation of the carriers (electrons) at the two edges of the gate electrode 16 close to the source electrode 10 allows the carriers (electrons) to flow to the drain electrode 12. The example vertical TFT can be formed using a deposition order of source layer, semiconductor layer, gate layer, semiconductor layer, and drain layer. The source and drain may be swapped depending on design needs. The only critical alignment is the patterning of the drain electrodes. The edges of the drain electrode should keep some distance from the edges of the gate electrode for a good performance.

Those skilled in the art will appreciate that multiple vertical TFTs such as those shown in FIG. 20 can be linked together to form a structure suitable for enabling matrix addressing.

It will be apparent to those skilled in the art that the structure of the VTFT can be also applied to build non-TFT transistors, such as conventional field effect transistors and CMOS transistors. CMOS type transistors are typically based on a single crystalline silicon or silicon-carbide. The conventional structure is lateral, with the source and the drain electrodes on the same plane. The vertical structure disclosed can significantly enhance the performance of those transistors, by conducting current vertically.

Although the invention has been described in connection with various illustrated embodiments, numerous modifications and adaptations may be made thereto without departing from the spirit and scope of the invention as set forth in the claims.

What is claimed is:

1. A vertical TFT, comprising:
a source electrode;
a drain electrode, the drain electrode and the source electrode being positioned on vertically separated planes;
a semiconductor layer arranged in between the source electrode and the drain electrode; and
at least one gate electrode embedded in the semiconductor layer;
wherein at least one of the source electrode and the drain electrode comprise patterned electrodes.

2. The vertical TFT in accordance with claim 1, wherein:
the at least one gate electrode is insulated from the semiconductor layer by an insulator; and
the insulator is formed by oxidation of the gate electrode via one of thermal annealing, joules heating, and an electric field assisted annealing process.

3. The vertical TFT in accordance with claim 1, wherein one or more of the source electrode, the drain electrode, and the at least one gate electrode is formed via a back side exposed fabrication technique.

4. The vertical TFT in accordance with claim 1, wherein:
each of the source electrode and the drain electrode comprise patterned electrodes;
each of the at least one gate electrode comprises an additional patterned electrode;
each of the patterned electrodes and additional patterned electrodes comprise substantially identical patterns.

5. The vertical TFT in accordance with claim 4, wherein the substantially identical patterns comprise one of micro perforations, a mesh structure, a lattice structure, or a comb-like structure.

6. The vertical TFT in accordance with claim 1, wherein:
the at least one gate electrode comprises a single gate electrode embedded in the semiconductor layer between the source electrode and the drain electrode;
the single gate electrode is a patterned electrode which is positioned to allow a flow of electrons to pass between the source electrode and the drain electrode.

7. The vertical TFT in accordance with claim 6, wherein:
the source electrode is a patterned electrode which comprises a first comb-like structure comprising one or more electrically connected fingers;
the drain electrode is a patterned electrode which comprises a second comb-like structure comprising one or more electrically connected fingers; and
the patterned gate electrode comprises a third comb-like structure comprising one or more electrically connected fingers.

8. The vertical TFT in accordance with claim 7, wherein the one or more fingers of the single gate electrode, the one or more fingers of the source electrode, and the one or more fingers of the drain electrode are all vertically aligned.

9. The vertical TFT in accordance with claim 1, wherein the source electrode and the drain electrode each comprise patterned electrodes.

10. The vertical TFT in accordance with claim 9, wherein:
the source electrode comprises a first comb-like structure comprising one or more electrically connected fingers; and the drain electrode comprises a second comb-like structure comprising one or more electrically connected fingers.

11. The vertical TFT in accordance with claim 10, wherein the at least one gate electrode also comprises a patterned electrode.

12. The vertical TFT in accordance with claim 11, wherein the at least one gate electrode comprises a third comb-like structure comprising one or more electrically connected fingers.

13. The vertical TFT in accordance with claim 12, wherein:
the at least one gate electrode comprises a first gate electrode and a second gate electrode arranged vertically above the first gate electrode; and
the one or more fingers of the first gate electrode are at least partially offset horizontally from the one or more fingers of the second gate electrode.

14. The vertical TFT in accordance with claim 13, wherein:
the first gate electrode is positioned on the same horizontal plane as the source electrode; and
the second gate electrode is positioned on the same horizontal plane as the drain electrode.

15. The vertical TFT in accordance with claim 13, wherein the one or more fingers of the first gate electrode are at least partially offset horizontally from the one or more fingers of the source electrode.

16. The vertical TFT in accordance with claim 15, wherein:
the one or more fingers of the first gate electrode are insulated from the semiconductor layer by an insulator; and
the insulator of the each of the one or more fingers of the first gate electrode is in contact with a corresponding one of the one or more fingers of source electrode over at least a portion of a length of the one or more fingers of the first gate electrode.

17. The vertical TFT in accordance with claim 15, wherein the one or more fingers of the first gate electrode are arranged between the one or more fingers of the source electrode.

18. The vertical TFT in accordance with claim 13, wherein the one or more fingers of the second gate electrode are at least partially offset horizontally from the one or more fingers of the drain electrode.

19. The vertical TFT in accordance with claim 18, wherein:
the one or more fingers of the second gate electrode are insulated from the semiconductor layer by an insulator; and
the insulator of each of the one or more fingers of the second gate electrode is in contact with a corresponding one of the one or more fingers of the drain electrode over at least a portion of a length of one or more fingers of the second gate electrode.

20. The vertical TFT in accordance with claim 18, wherein the one or more fingers of the second gate electrode are arranged between the one or more fingers of the drain electrode.

* * * * *